US012588208B2

(12) United States Patent (10) Patent No.: US 12,588,208 B2
Iwai et al. (45) Date of Patent: Mar. 24, 2026

(54) THREE-DIMENSIONAL MEMORY DEVICE CONTAINING INSULATED GATE LOCATED OVER A TOP SOURCE LAYER FOR APPLYING GIDL ERASE VOLTAGE AND METHOD FOR MANUFACTURING THE SAME

(71) Applicant: SANDISK TECHNOLOGIES LLC, Addison, TX (US)

(72) Inventors: Takaaki Iwai, Yokkaichi (JP); Shinsuke Yada, Yokkaichi (JP); Satoshi Shimizu, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 400 days.

(21) Appl. No.: 18/357,634

(22) Filed: Jul. 24, 2023

(65) Prior Publication Data

US 2024/0292616 A1 Aug. 29, 2024

Related U.S. Application Data

(60) Provisional application No. 63/487,097, filed on Feb. 27, 2023.

(51) Int. Cl.
*H10B 43/27* (2023.01)
*G11C 16/04* (2006.01)
*H10B 41/10* (2023.01)
*H10B 41/27* (2023.01)
*H10B 41/35* (2023.01)
(Continued)

(52) U.S. Cl.
CPC ......... *H10B 43/27* (2023.02); *G11C 16/0483* (2013.01); *H10B 41/10* (2023.02); *H10B*

*41/27* (2023.02); *H10B 41/35* (2023.02); *H10B 43/10* (2023.02); *H10B 43/35* (2023.02)

(58) Field of Classification Search
CPC .................... H10B 41/20–27; H10B 43/20–27
See application file for complete search history.

(56) References Cited

U.S. PATENT DOCUMENTS

| | | | |
|---|---|---|---|
| 9,985,098 | B2 | 5/2018 | Matsumoto et al. |
| 10,008,570 | B2 | 6/2018 | Yu et al. |
| 10,020,363 | B2 | 7/2018 | Ogawa et al. |

(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Chad M Dicke
*Assistant Examiner* — Dave Tan
(74) *Attorney, Agent, or Firm* — THE MARBURY LAW GROUP PLLC

(57) ABSTRACT

A memory device includes a source layer, an alternating stack of insulating layers and electrically conductive layers located over a proximal horizontal surface of the source layer, a memory opening vertically extending through the alternating stack, a memory opening fill structure located in the memory opening and containing a memory film and a vertical semiconductor channel, a source-control-gate dielectric located over a distal horizontal surface of the source layer which is opposite to the proximal surface of the source layer, and a source-control electrode located over the source-control-gate dielectric.

20 Claims, 37 Drawing Sheets

(51) Int. Cl.
      *H10B 43/10*          (2023.01)
      *H10B 43/35*          (2023.01)

(56)                    References Cited

U.S. PATENT DOCUMENTS

| | | | |
|---|---|---|---|
| 10,381,443 B2 | 8/2019 | Matsumoto et al. | |
| 10,566,059 B2 | 2/2020 | Diep et al. | |
| 10,629,611 B2 | 4/2020 | Cui et al. | |
| 10,629,613 B1 | 4/2020 | Shimizu et al. | |
| 10,629,616 B1 | 4/2020 | Kai et al. | |
| 10,692,884 B2 | 6/2020 | Cui et al. | |
| 11,049,568 B1 | 6/2021 | Yada | |
| 11,121,153 B1 | 9/2021 | Obu et al. | |
| 11,127,759 B2 | 9/2021 | Obu et al. | |
| 11,195,781 B2 | 12/2021 | Okina et al. | |
| 11,201,107 B2 | 12/2021 | Okina et al. | |
| 11,355,486 B2 | 6/2022 | Mizutani et al. | |
| 11,393,836 B2 | 7/2022 | Tsutsumi et al. | |
| 11,482,539 B2 | 10/2022 | Sharangpani et al. | |
| 11,501,835 B2 | 11/2022 | Yada et al. | |
| 11,508,711 B2 | 11/2022 | Ninomiya et al. | |
| 11,631,690 B2 | 4/2023 | Okina et al. | |
| 11,676,954 B2 | 6/2023 | Rabkin et al. | |
| 2018/0122904 A1 | 5/2018 | Matsumoto et al. | |
| 2018/0122905 A1 | 5/2018 | Ogawa et al. | |
| 2018/0122906 A1 | 5/2018 | Yu et al. | |
| 2018/0261671 A1 | 9/2018 | Matsumoto et al. | |
| 2019/0326313 A1 | 10/2019 | Cui et al. | |
| 2019/0333581 A1 | 10/2019 | Diep et al. | |
| 2021/0035965 A1 | 2/2021 | Mizutani et al. | |
| 2021/0091063 A1 | 3/2021 | Ninomiya et al. | |
| 2021/0265379 A1 | 8/2021 | Obu et al. | |
| 2021/0265380 A1 | 8/2021 | Obu et al. | |
| 2022/0130853 A1 | 4/2022 | Sharangpani et al. | |
| 2022/0157841 A1 | 5/2022 | Tsutsumi et al. | |
| 2022/0157842 A1 | 5/2022 | Tsutsumi et al. | |
| 2022/0189984 A1 | 6/2022 | Okina | |
| 2022/0208748 A1 | 6/2022 | Rabkin et al. | |
| 2022/0336484 A1 | 10/2022 | Iwai et al. | |
| 2023/0016518 A1 | 1/2023 | Lien et al. | |
| 2023/0028532 A1* | 1/2023 | Kohji | H10B 41/27 |

OTHER PUBLICATIONS

U.S. Appl. No. 17/485,949, filed Sep. 27, 2021, SanDisk Technologies LLC.
U.S. Appl. No. 17/577,533, filed Jan. 18, 2022, SanDisk Technologies LLC.
U.S. Appl. No. 17/655,272, filed Mar. 17, 2022, SanDisk Technologies LLC.
U.S. Appl. No. 17/659,057, filed Apr. 13, 2022, SanDisk Technologies LLC.
U.S. Appl. No. 17/661,783, filed May 3, 2022, SanDisk Technologies LLC.
U.S. Appl. No. 17/662,926, filed May 11, 2022, SanDisk Technologies LLC.
U.S. Appl. No. 17/684,975, filed Mar. 2, 2022, SanDisk Technologies LLC.
U.S. Appl. No. 17/811,145, filed Jul. 7, 2022, SanDisk Technologies LLC.
U.S. Appl. No. 17/931,362, filed Sep. 12, 2022, SanDisk Technologies LLC.
U.S. Appl. No. 18/350,573, filed Jul. 11, 2023, SanDisk Technologies LLC.
U.S. Appl. No. 18/351,181, filed Jul. 12, 2023, SanDisk Technologies LLC.
U.S. Appl. No. 18/351,235, filed Jul. 12, 2023, SanDisk Technologies LLC.
U.S. Appl. No. 18/355,765, filed Jul. 20, 2023, SanDisk Technologies LLC.

* cited by examiner

1

THREE-DIMENSIONAL MEMORY DEVICE CONTAINING INSULATED GATE LOCATED OVER A TOP SOURCE LAYER FOR APPLYING GIDL ERASE VOLTAGE AND METHOD FOR MANUFACTURING THE SAME

FIELD

The present disclosure relates generally to the field of semiconductor devices, and particularly to a three-dimensional memory device containing an insulated gate located over a top source layer for applying GIDL erase voltage and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device includes a source layer, an alternating stack of insulating layers and electrically conductive layers located over a proximal horizontal surface of the source layer, a memory opening vertically extending through the alternating stack, a memory opening fill structure located in the memory opening and containing a memory film and a vertical semiconductor channel, a source-control-gate dielectric located over a distal horizontal surface of the source layer which is opposite to the proximal surface of the source layer, and a source-control electrode located over the source-control-gate dielectric.

According to another aspect of the present disclosure, a method of forming a memory device comprises: forming an alternating stack of insulating layers and spacer material layers over a proximal horizontal surface of a source layer, wherein the spacer material layers are formed as, or are subsequently replaced with, electrically conductive layers; forming a memory opening through the alternating stack; forming a memory opening fill structure in the memory opening, wherein the memory opening fill structure comprises a memory film and a vertical semiconductor channel; forming a tubular cavity by removing a portion of the memory film that is proximal to a distal horizontal surface of the source layer that is opposite to the proximal surface of the source layer; forming a tubular source strap in the tubular cavity; exposing a distal portion of an inner sidewall of the vertical semiconductor channel; forming a source-control-gate dielectric on the distal portion of the inner sidewall of the vertical semiconductor channel and on the distal horizontal surface of the source layer; and forming a source-control electrode over the source-control-gate dielectric.

2

Figure 2:
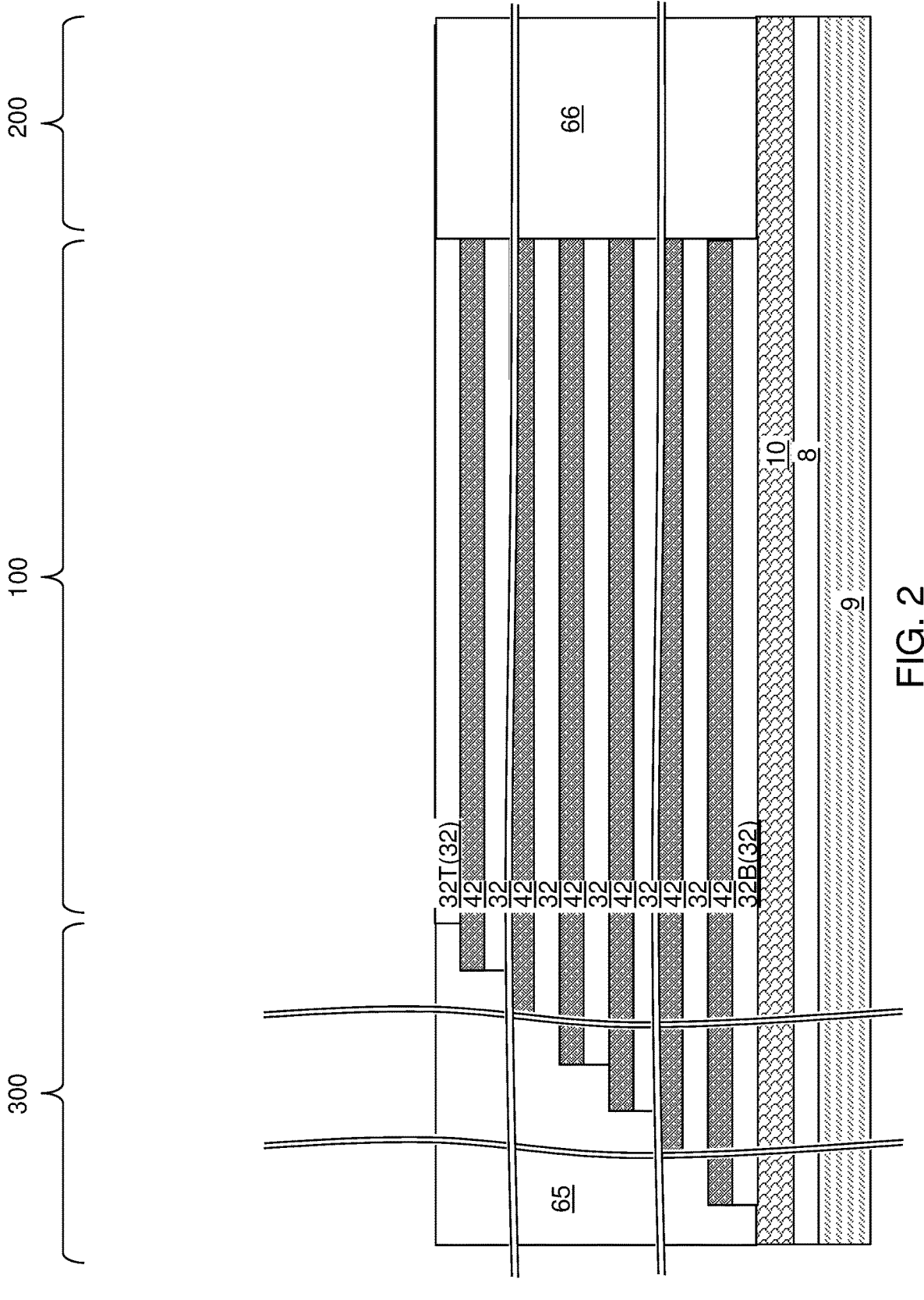

FIG. 2 is a schematic vertical cross-sectional view of the exemplary structure after formation of stepped terraces and a retro-stepped dielectric material portion according to the embodiment of the present disclosure.

Figure 3A:
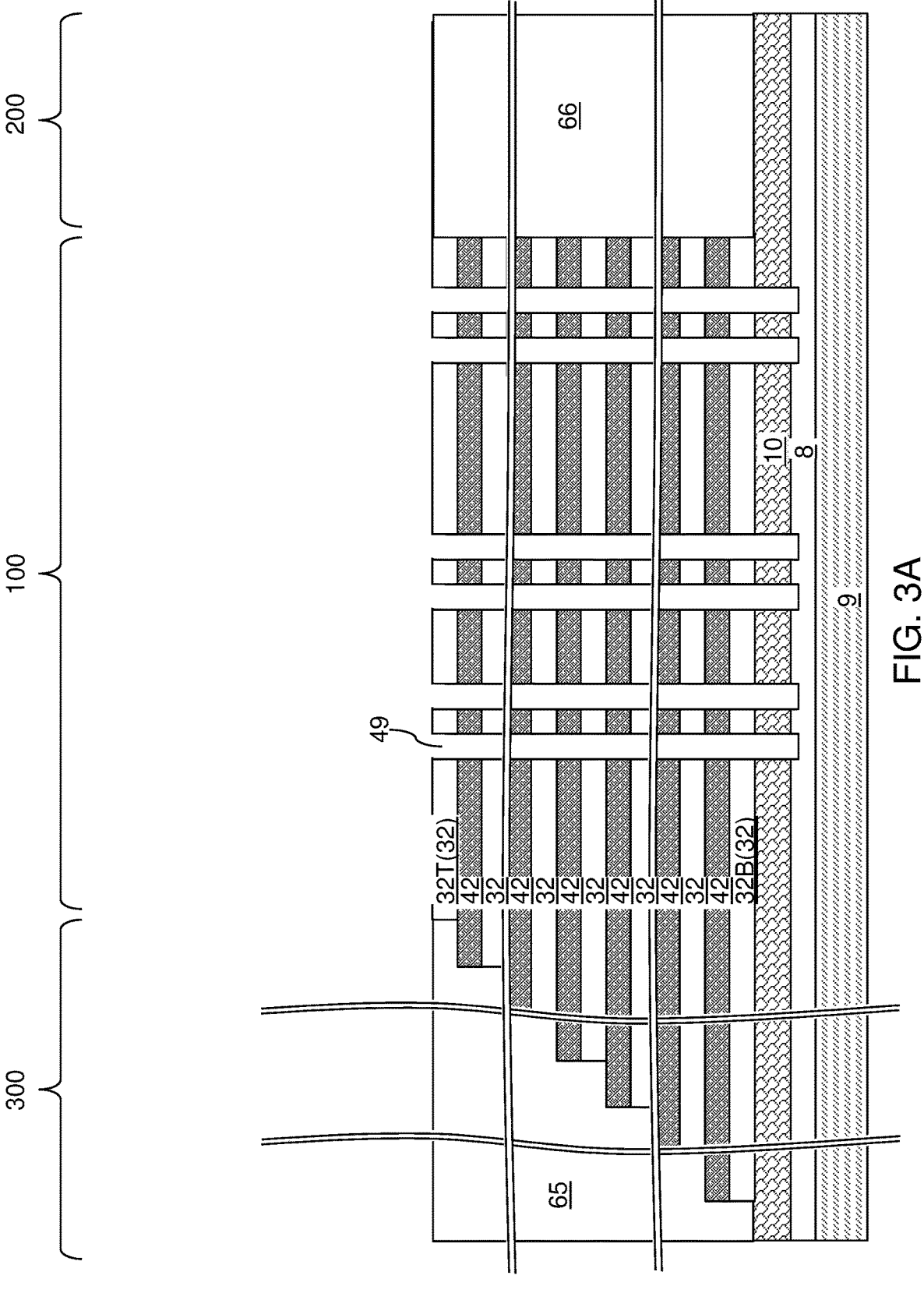

FIG. 3A is a schematic vertical cross-sectional view of the exemplary structure after formation of memory openings and support openings according to the embodiment of the present disclosure.

Figure 3B:
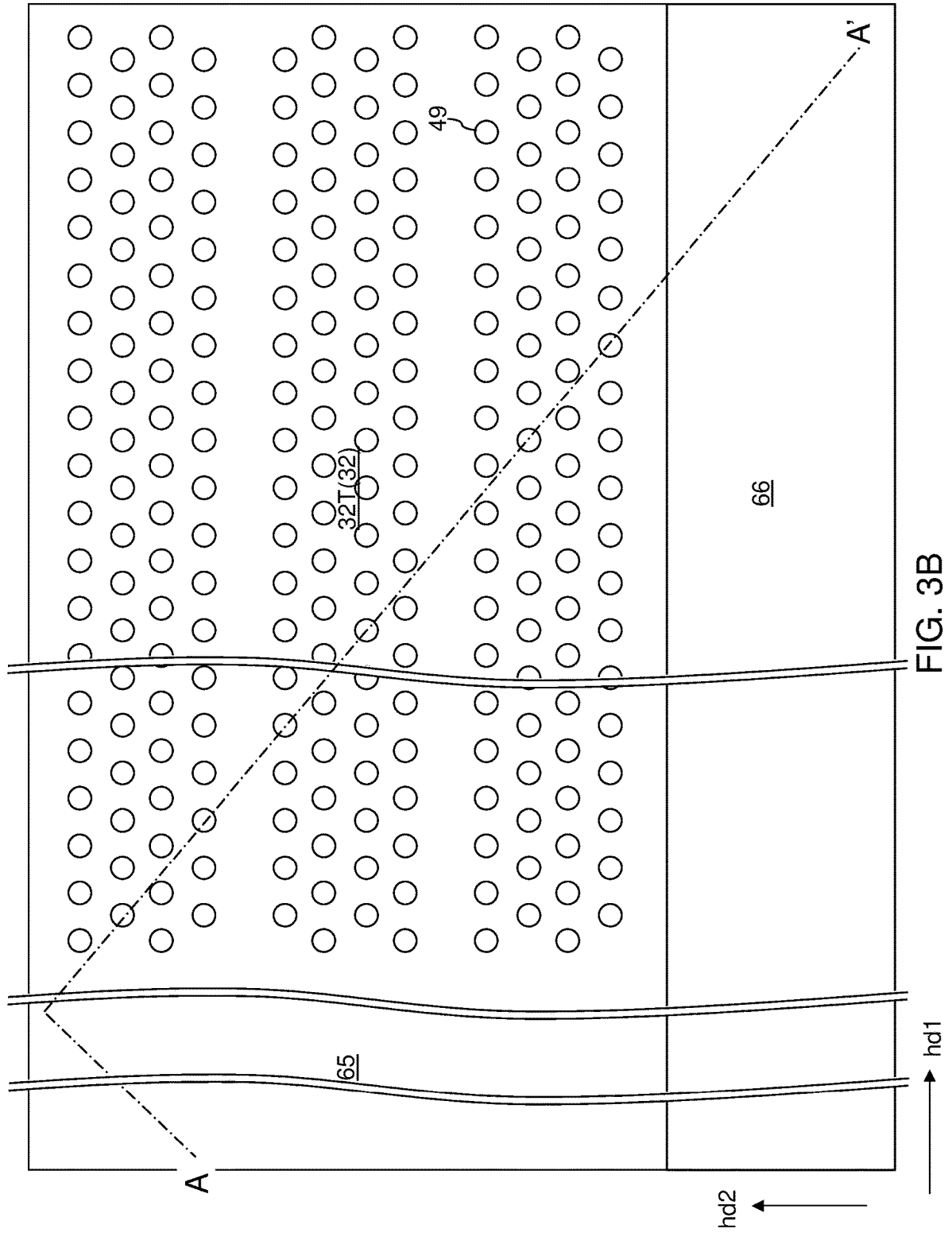

FIG. 3B is a top-down view of the exemplary structure of FIG. 3A. The vertical plane A-A' is the plane of the cross-section for FIG. 3A.

FIGS. 4A-4D are sequential vertical cross-sectional views of a memory opening during formation of a memory opening fill structure according to an embodiments of the present disclosure.

Figure 5A:
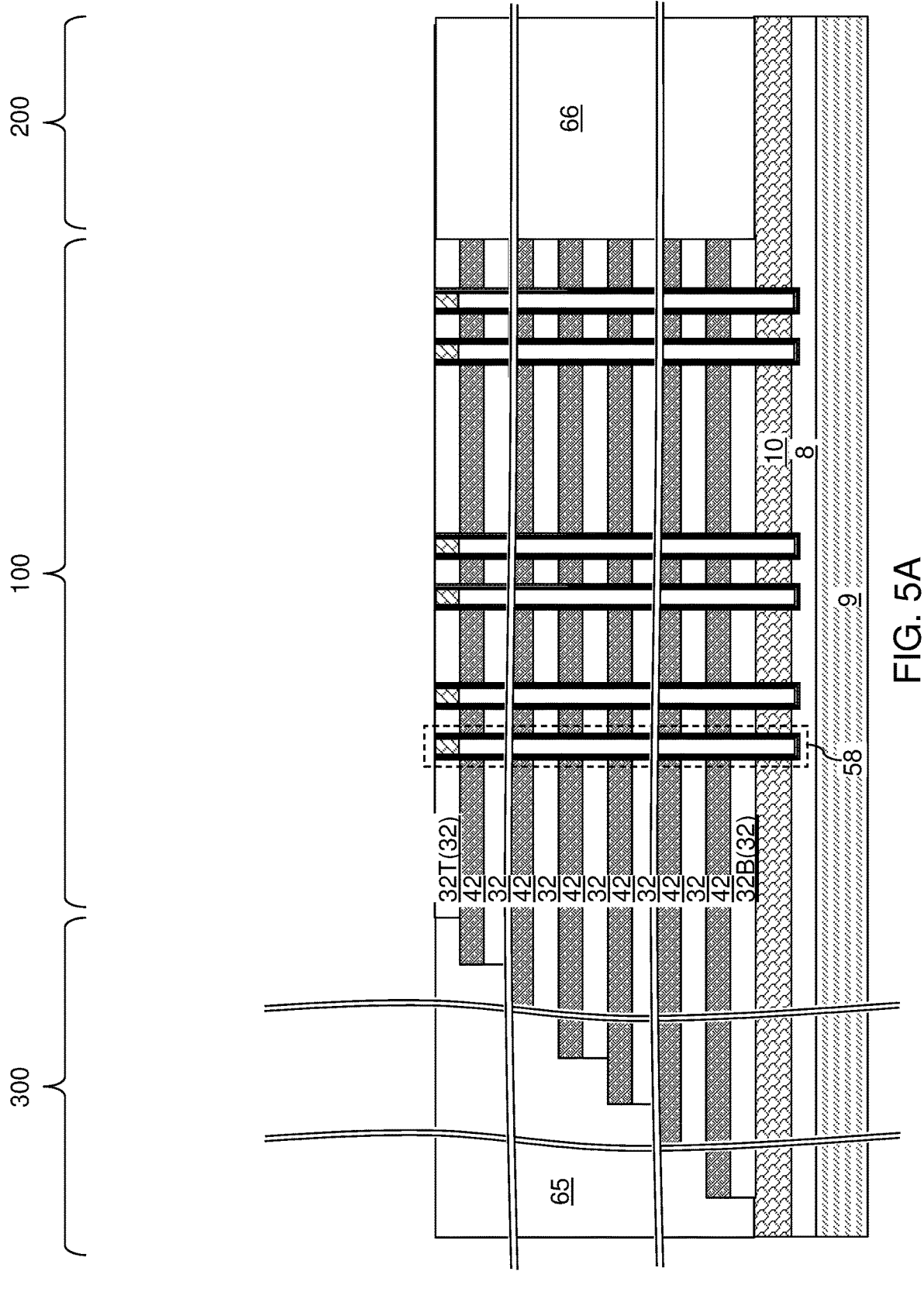

FIG. 5A is a vertical cross-sectional view of the exemplary structure after formation of memory opening fill structures according to an embodiment of the present disclosure.

Figure 5B:
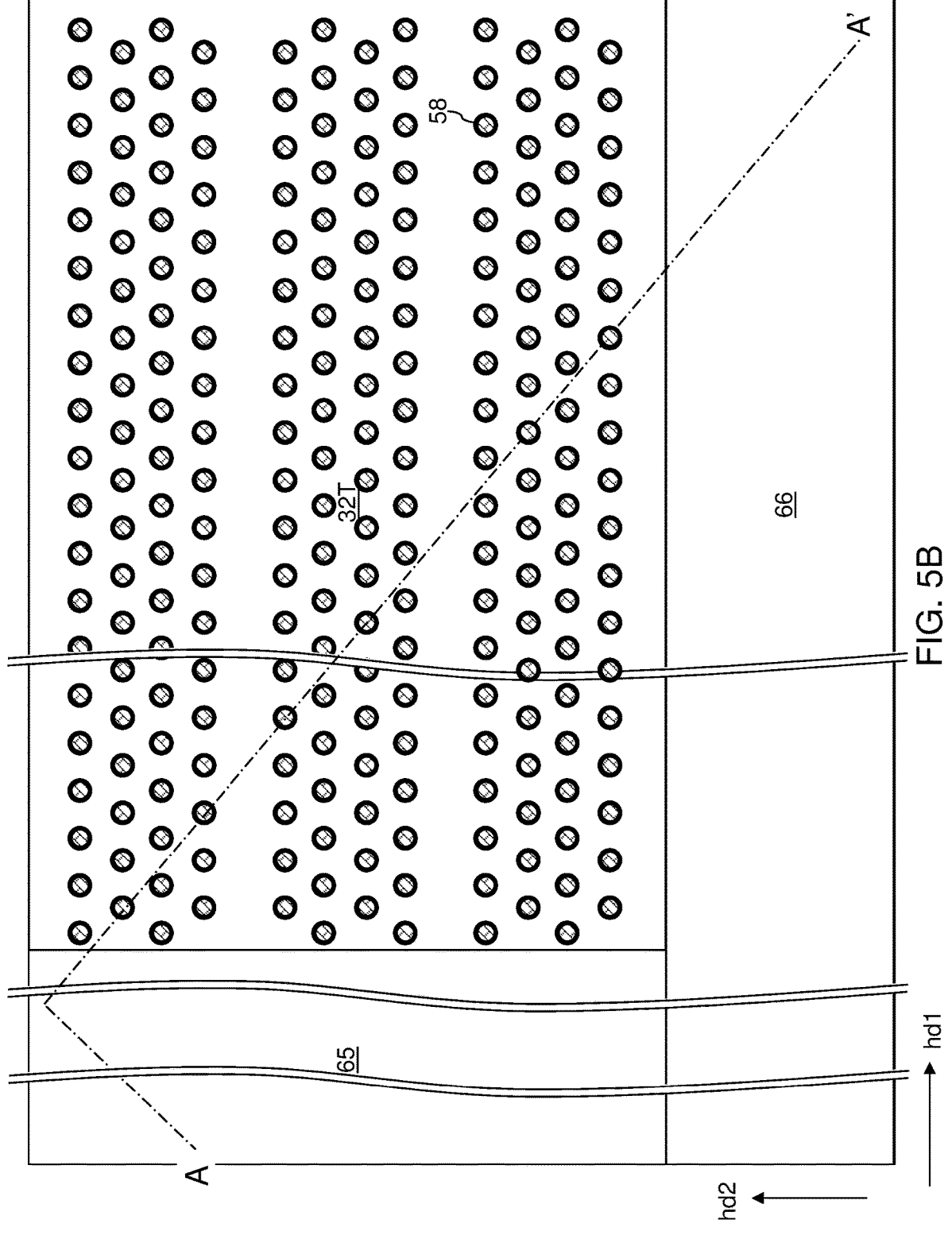

FIG. 5B is a top-down view of the exemplary structure of FIG. 5A. The vertical plane A-A' is the cut plane of the vertical cross-sectional view of FIG. 5A.

Figure 6A:
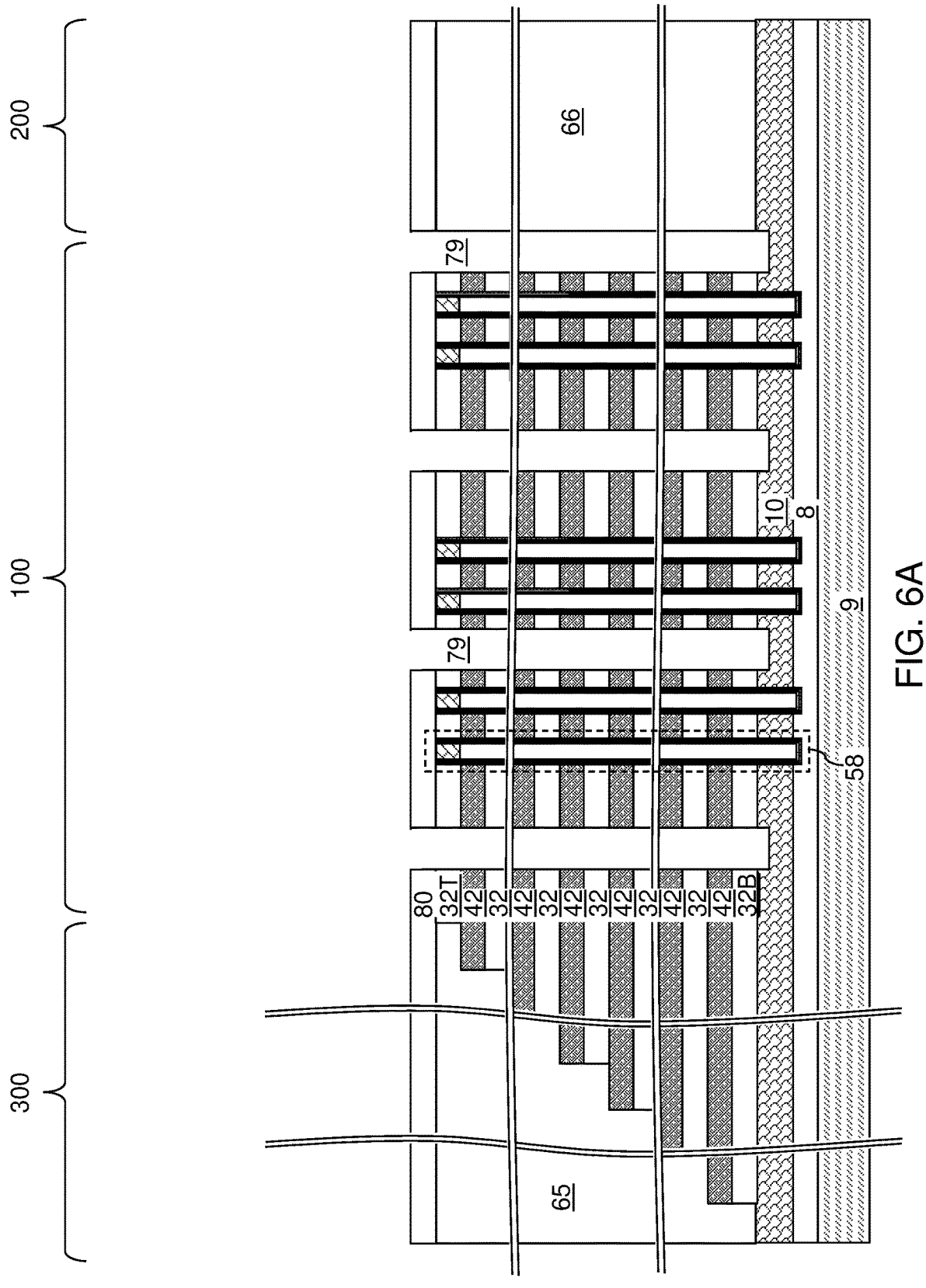

FIG. 6A is a vertical cross-sectional view of the exemplary structure after formation of access trenches according to an embodiment of the present disclosure.

Figure 6B:
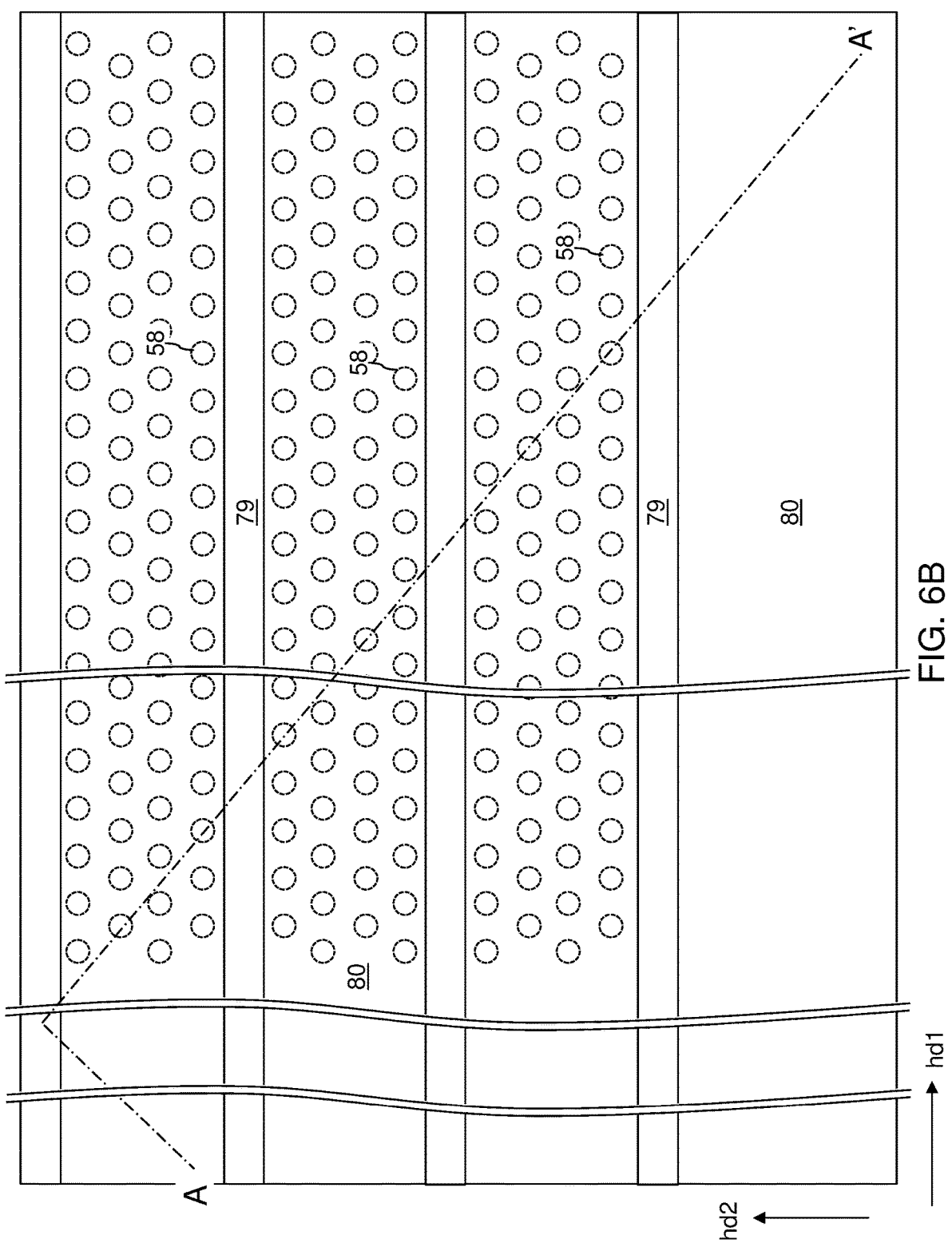

FIG. 6B is a top-down view of the exemplary structure of FIG. 6A. The vertical plane A-A' is the cut plane of the vertical cross-sectional view of FIG. 6A.

Figure 7:
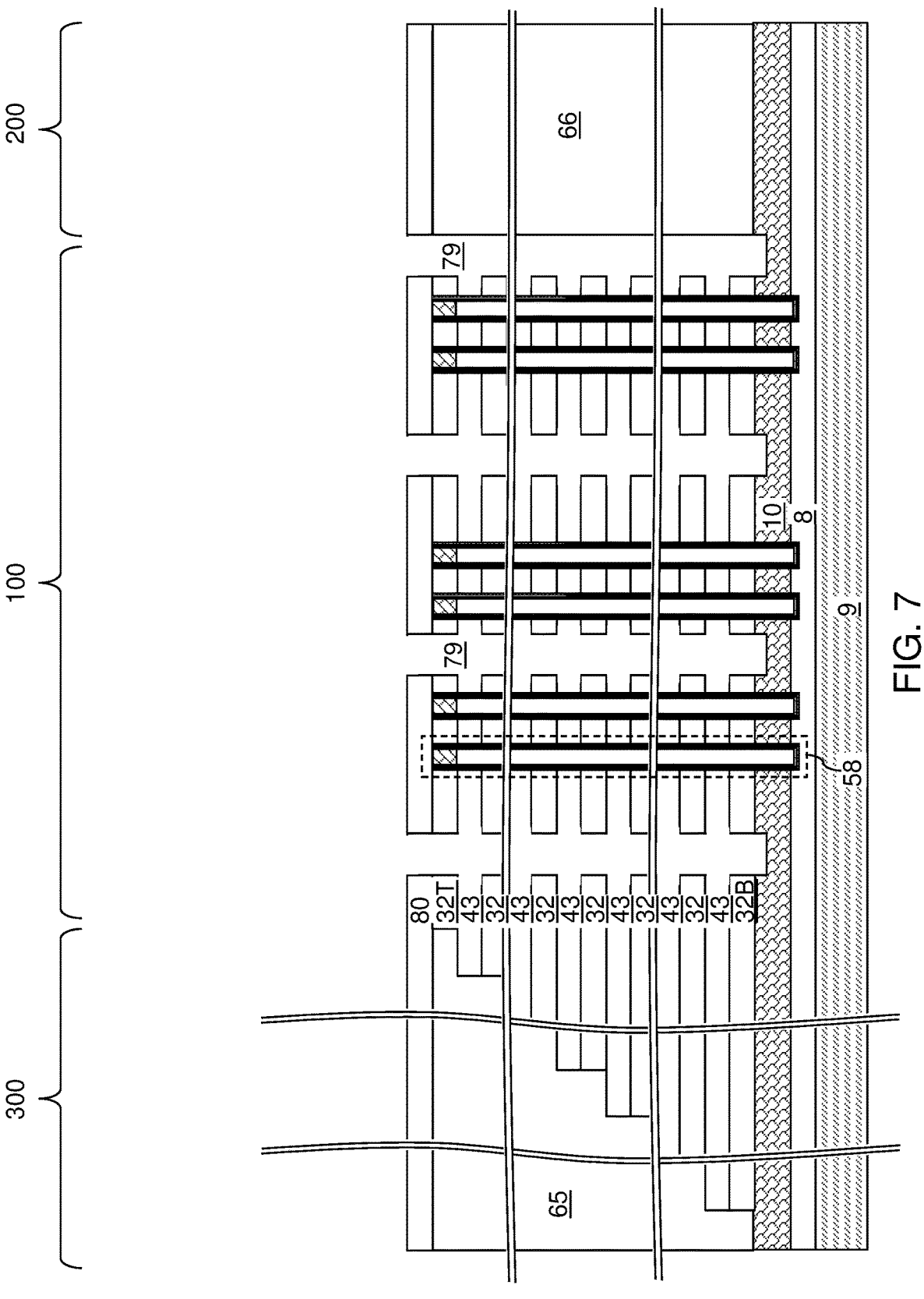

FIG. 7 is a vertical cross-sectional view of the exemplary structure after formation of backside recesses according to an embodiment of the present disclosure.

Figure 8:
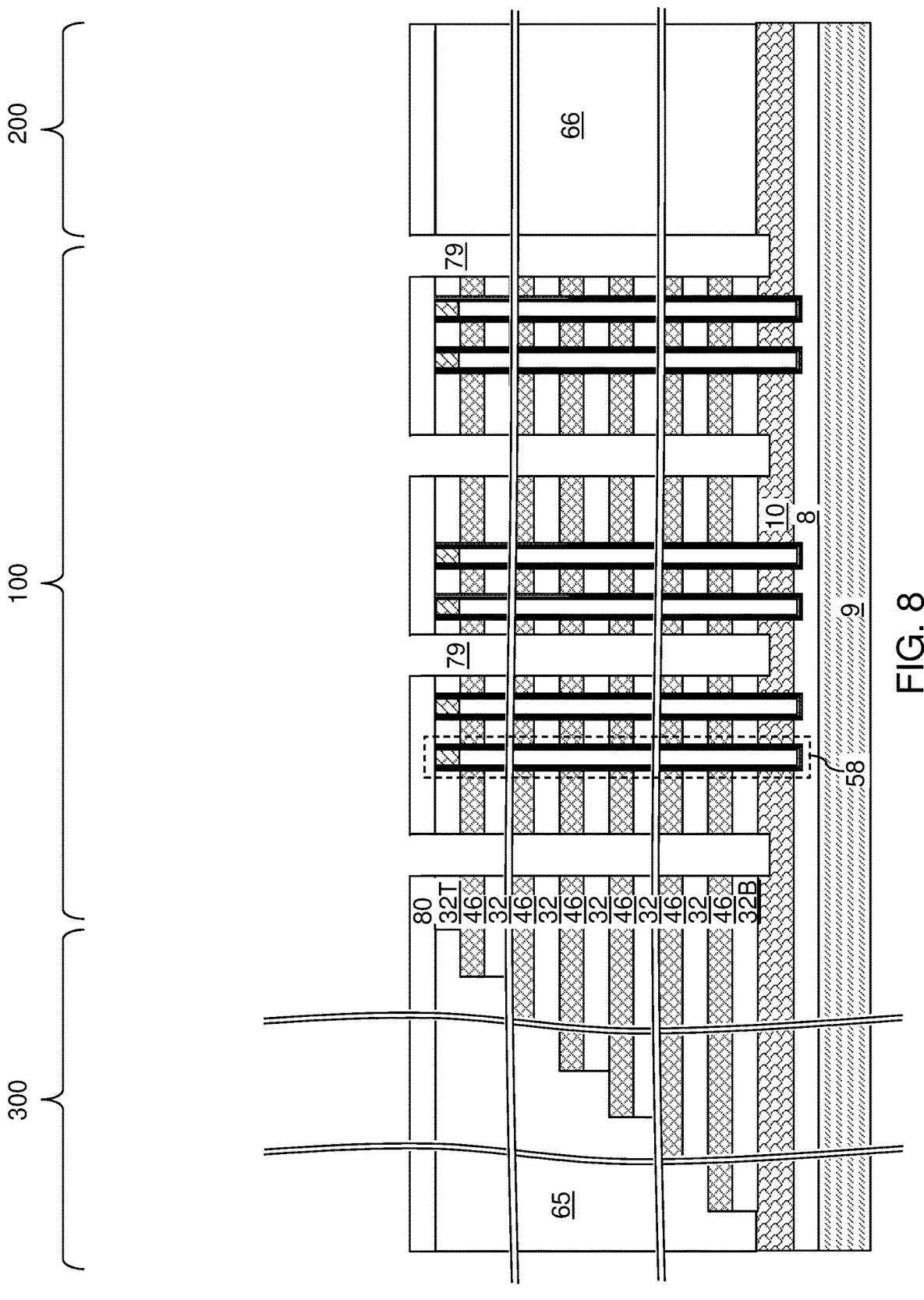

FIG. 8 is a vertical cross-sectional view of the exemplary structure after formation of electrically conductive layers according to an embodiment of the present disclosure.

Figure 9:
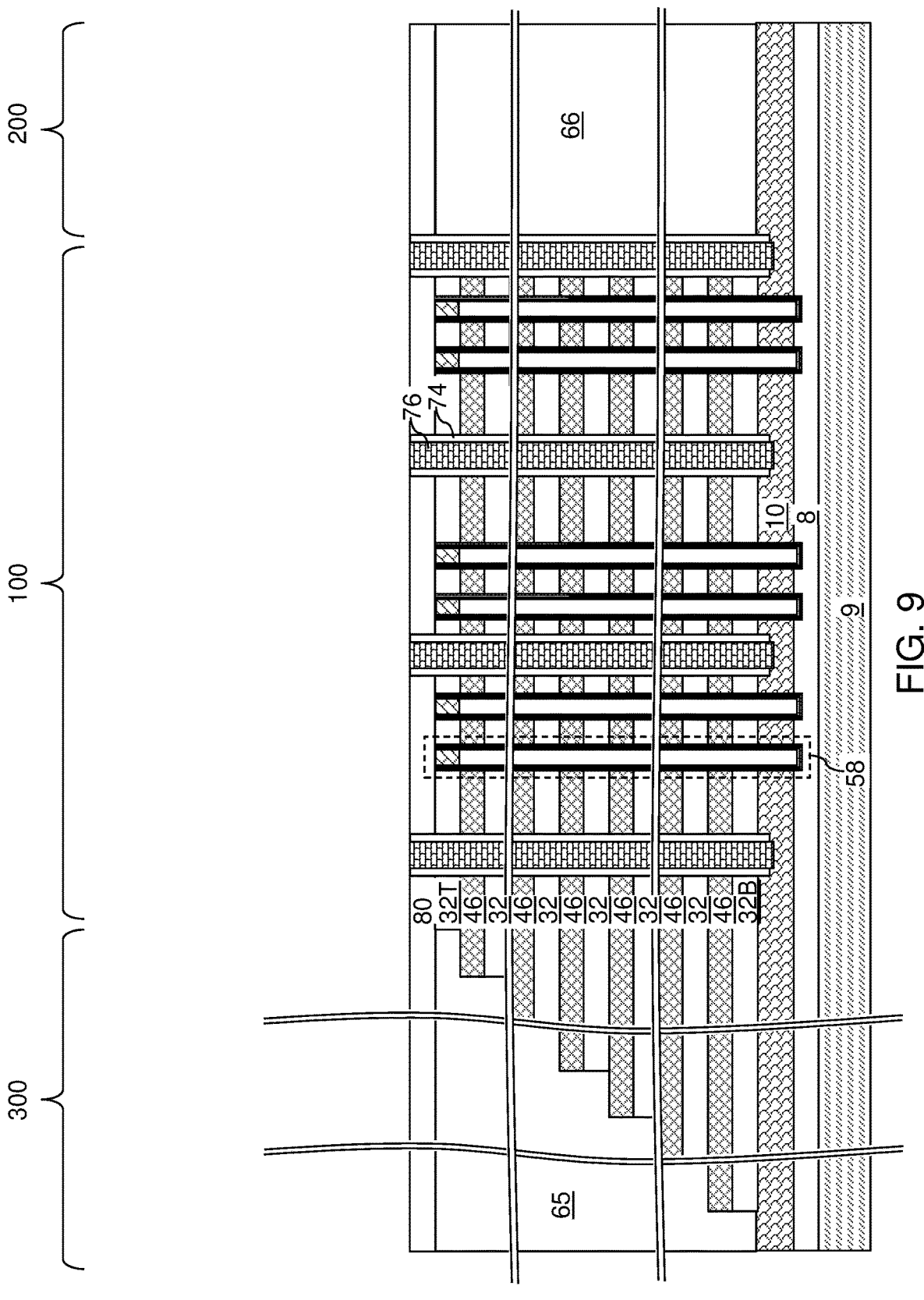

FIG. 9 is a vertical cross-sectional view of the exemplary structure after formation of access trench fill structures according to an embodiment of the present disclosure.

Figure 10A:
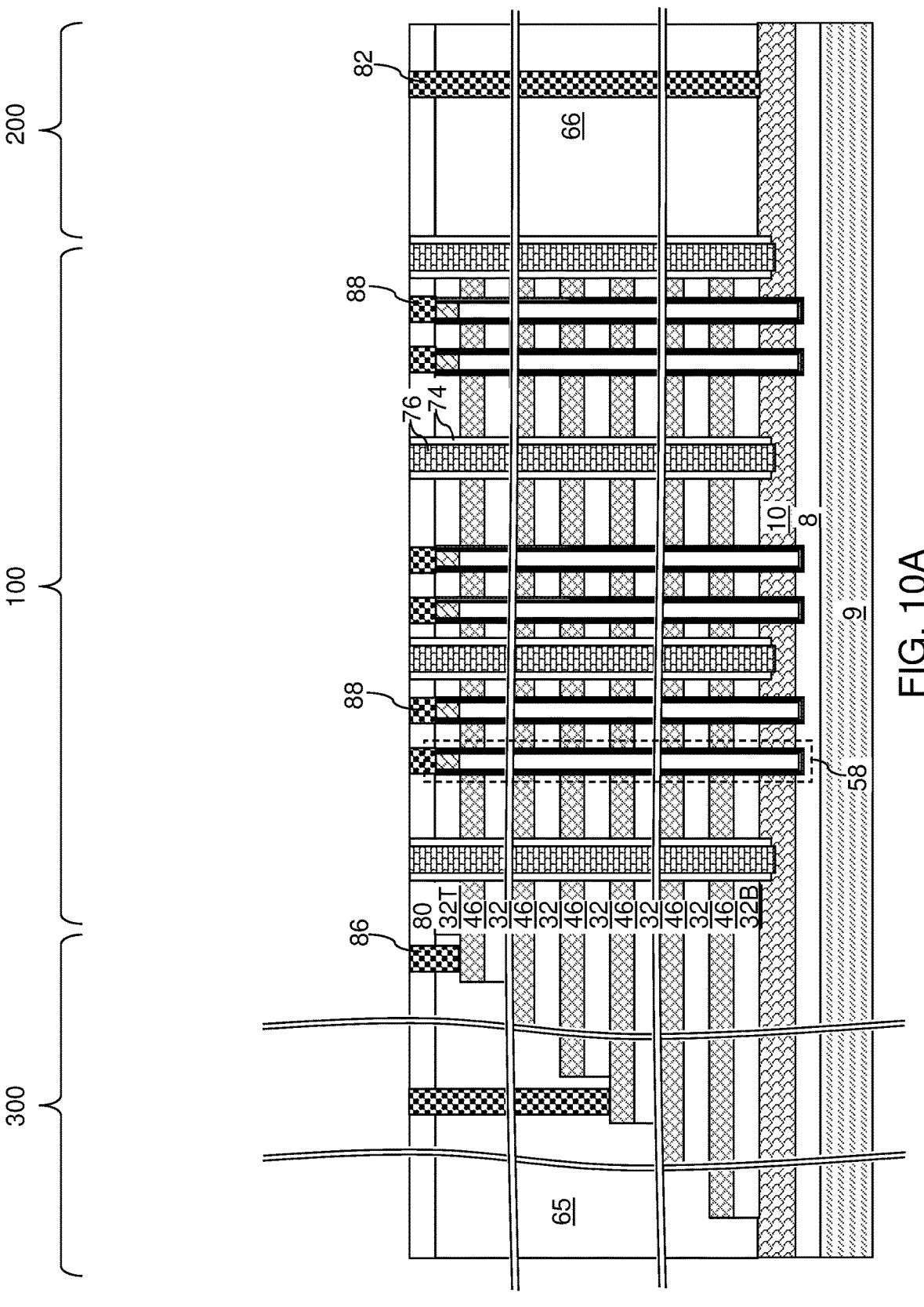

FIG. 10A is a vertical cross-sectional view of the exemplary structure after formation of contact via structures according to an embodiment of the present disclosure.

Figure 10B:
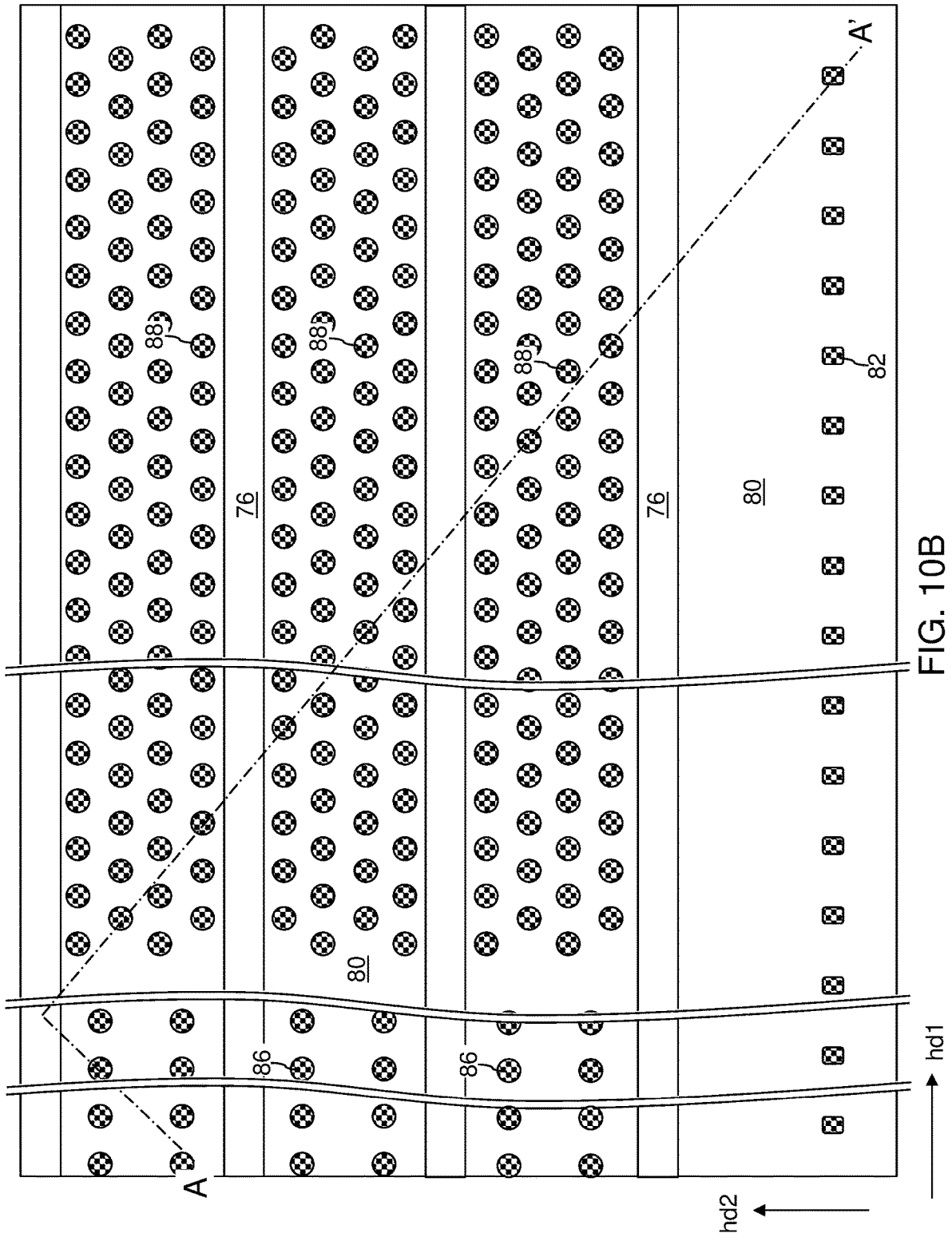

FIG. 10B is a top-down view of the exemplary structure of FIG. 10A. The vertical plane A-A' is the cut plane of the vertical cross-sectional view of FIG. 10A.

Figure 11A:
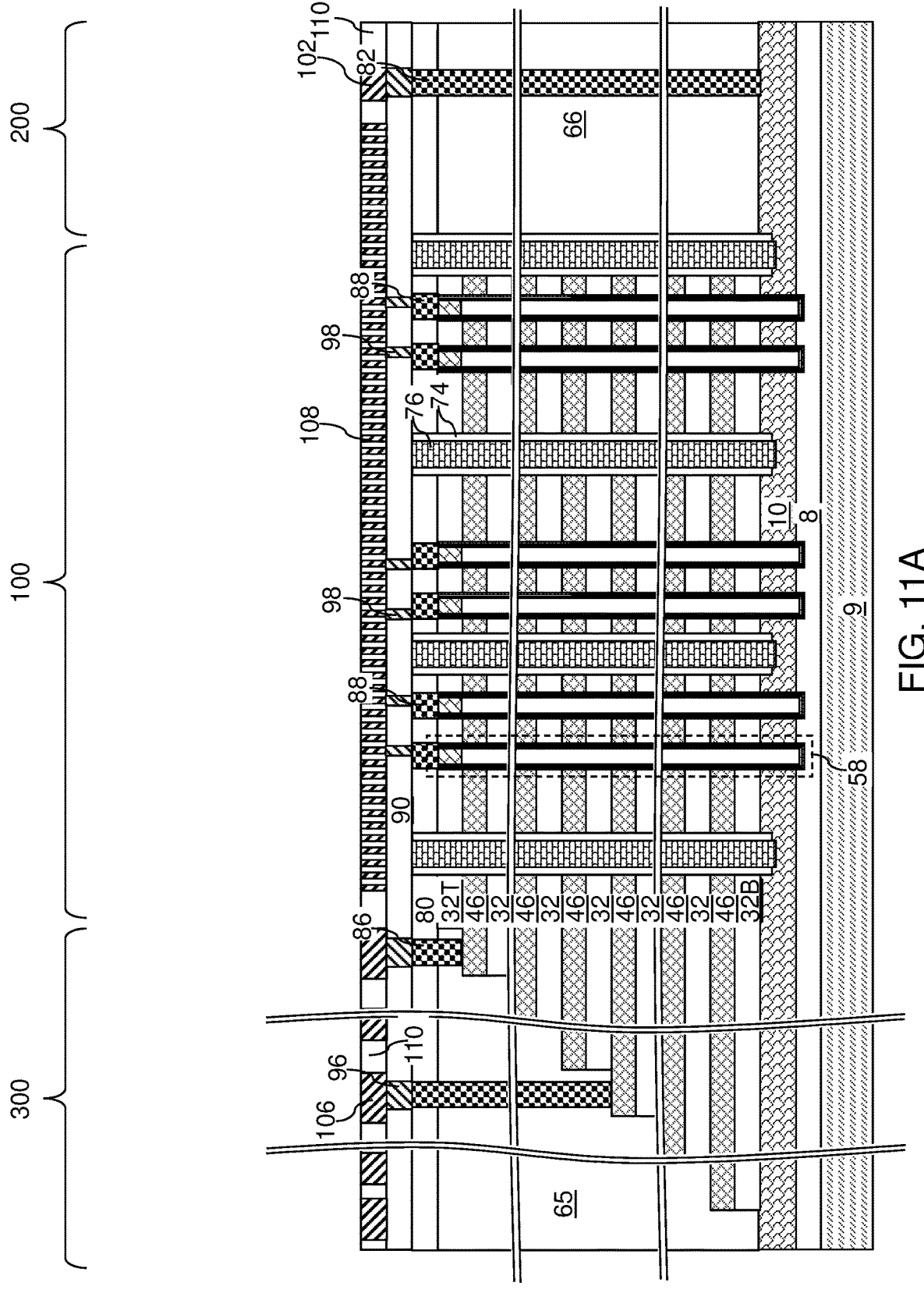

FIG. 11A is a vertical cross-sectional view of the exemplary structure after formation of connection via structures and first-level metal lines including bit lines according to an embodiment of the present disclosure.

Figure 11B:
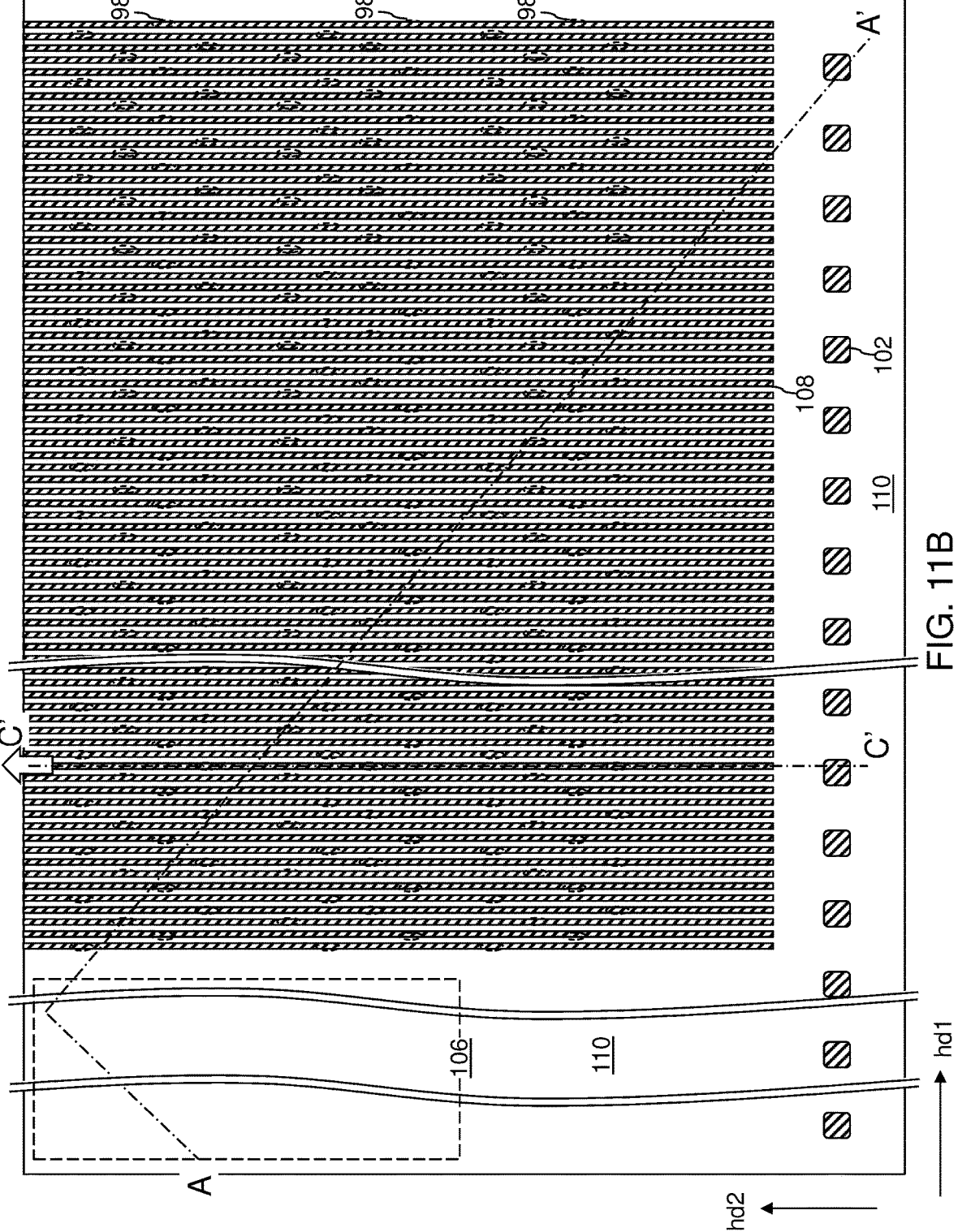

FIG. 11B is a top-down view of the exemplary structure of FIG. 11A. The vertical plane A-A' is the cut plane of the vertical cross-sectional view of FIG. 11A.

Figure 12:
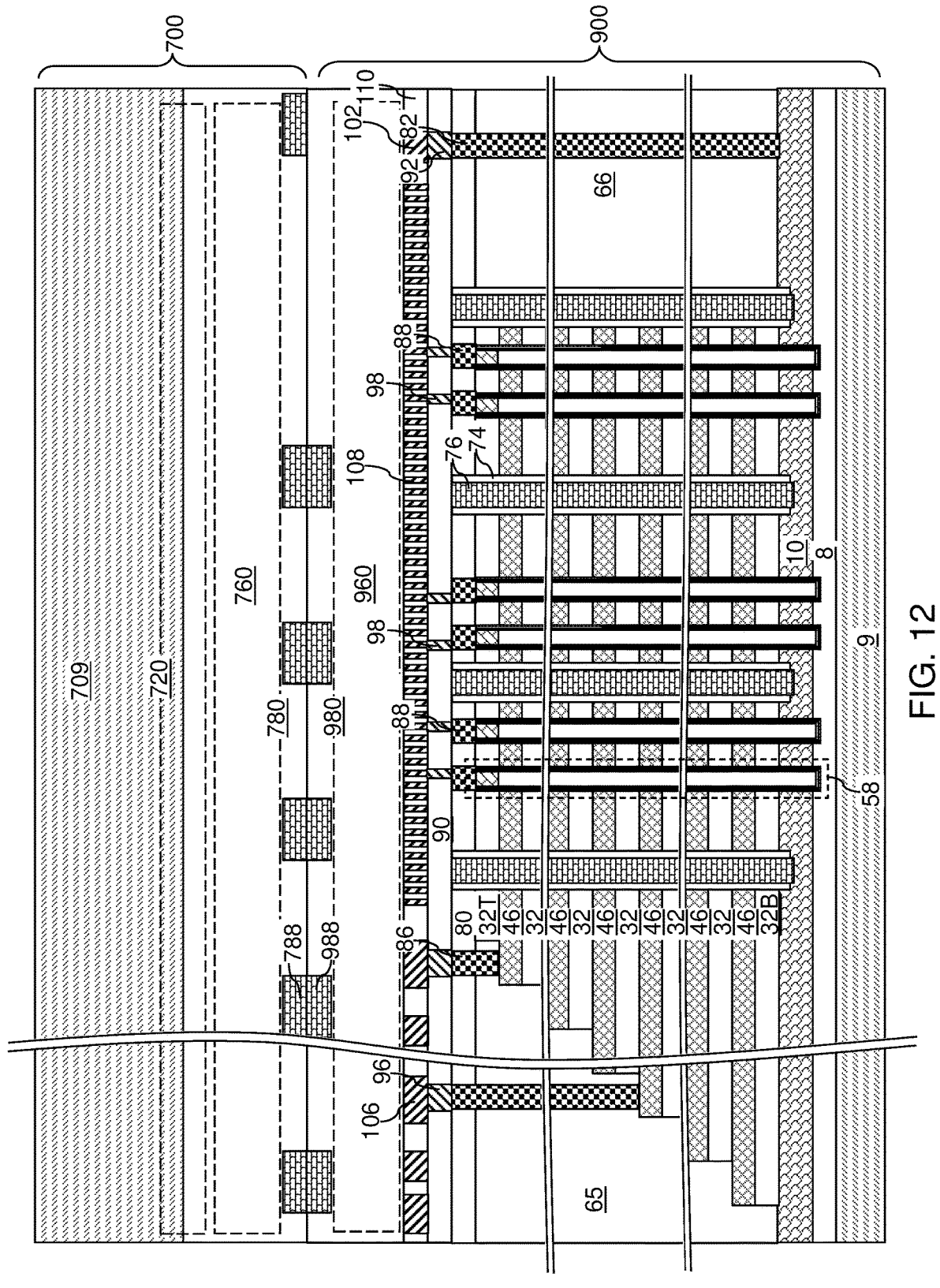

FIG. 12 is a vertical cross-sectional view of the exemplary structure after formation of additional metal interconnect structures and memory-side bonding pads and attaching a logic die to a memory die according to an embodiment of the present disclosure.

Figure 13A:
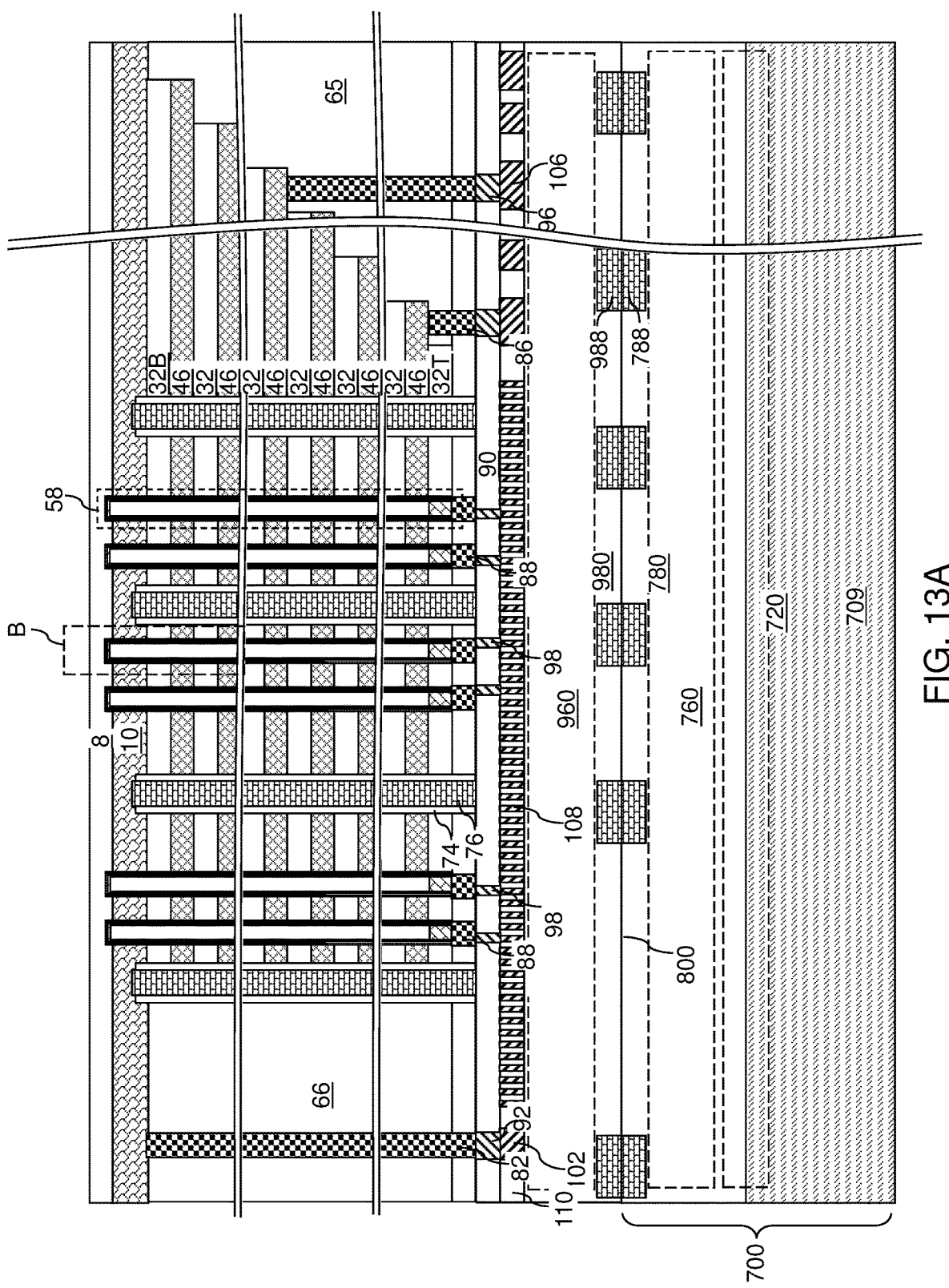

FIG. 13A is a vertical cross-sectional view of the exemplary structure after removal of the carrier substrate according to an embodiment of the present disclosure.

Figure 13B:
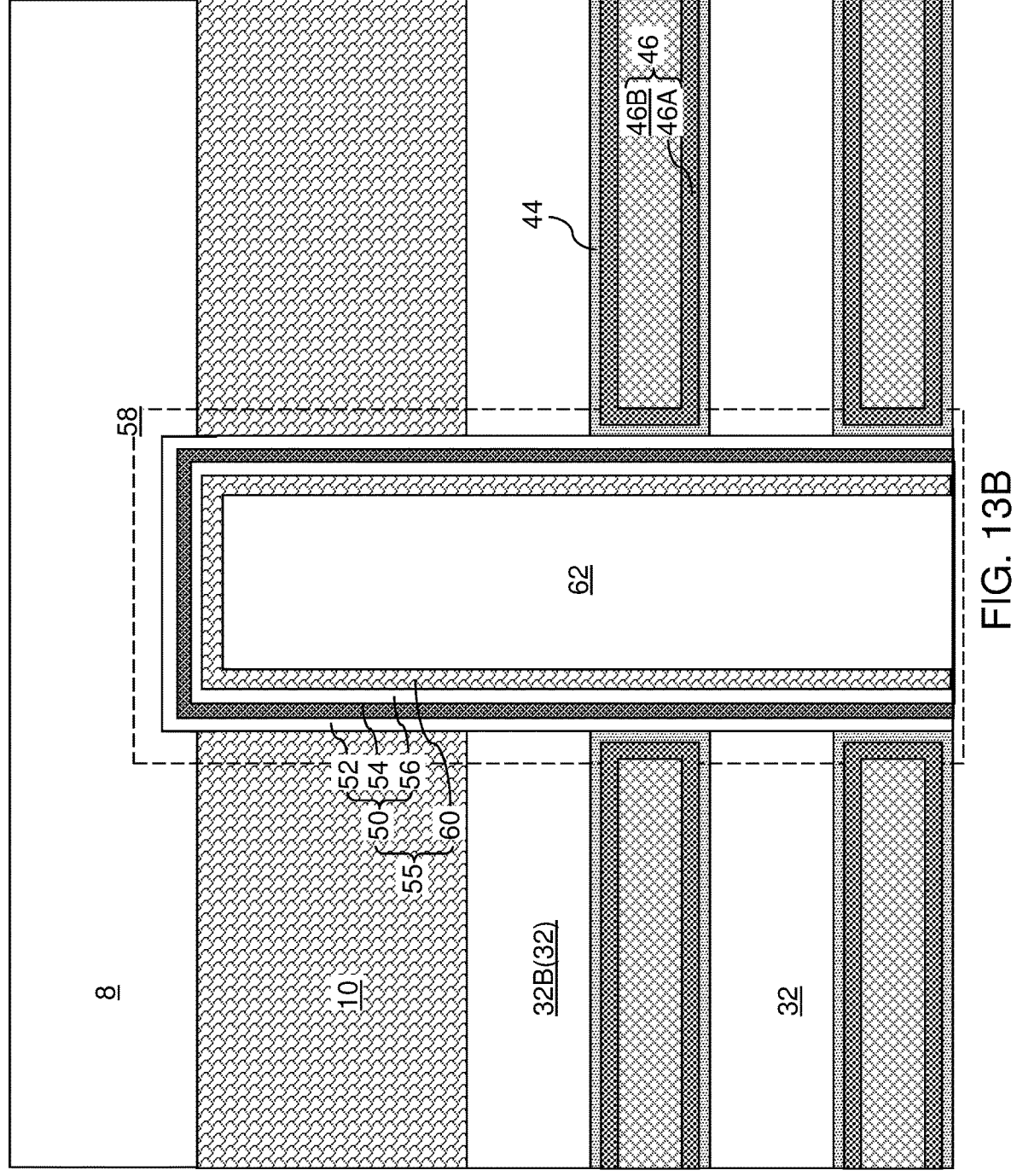

FIG. 13B is a magnified view of region B in FIG. 13A.

Figure 14A:
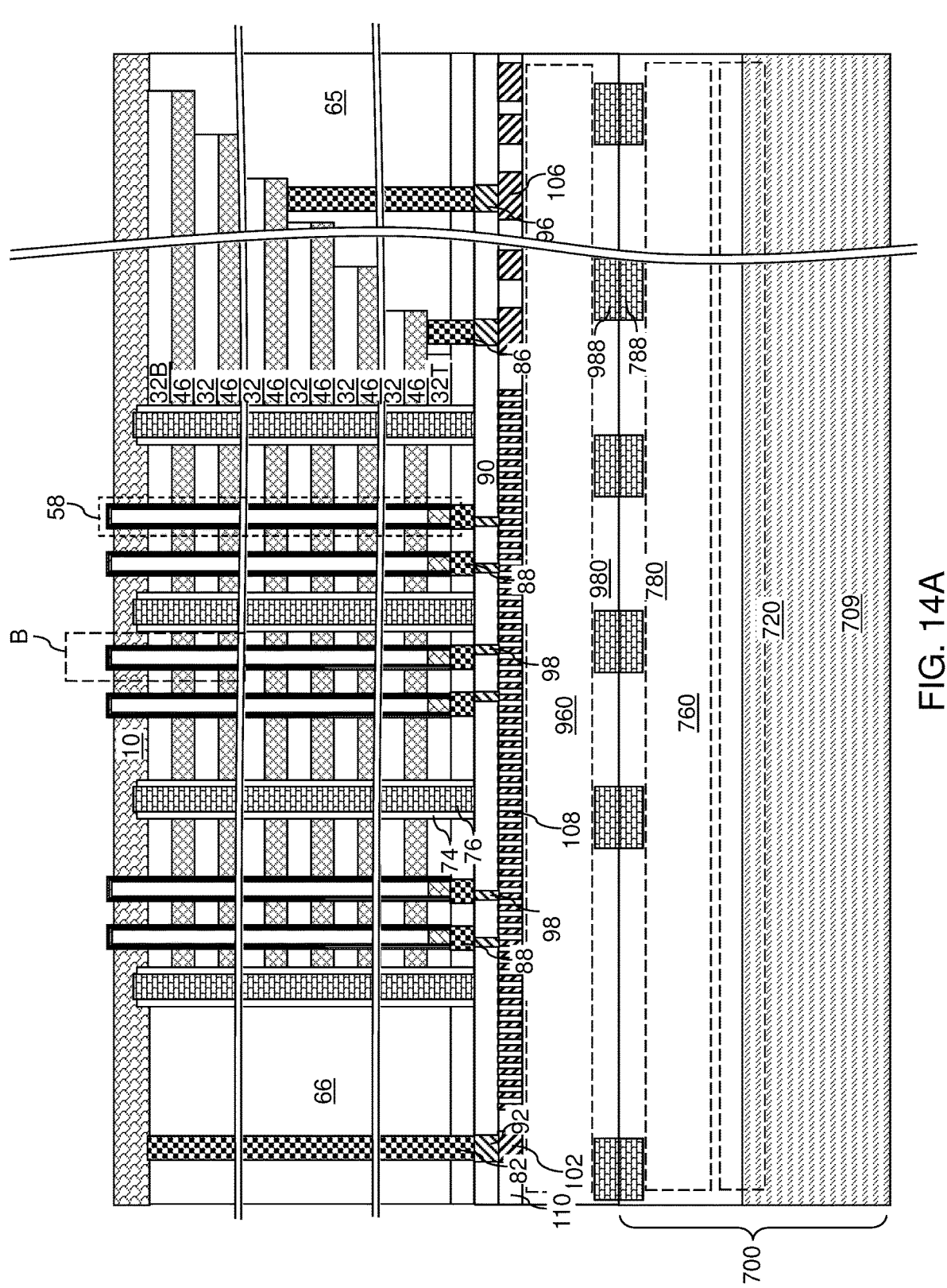

FIG. 14A is a vertical cross-sectional view of the exemplary structure after physically exposing end portions of the memory films according to an embodiment of the present disclosure.

Figure 14B:
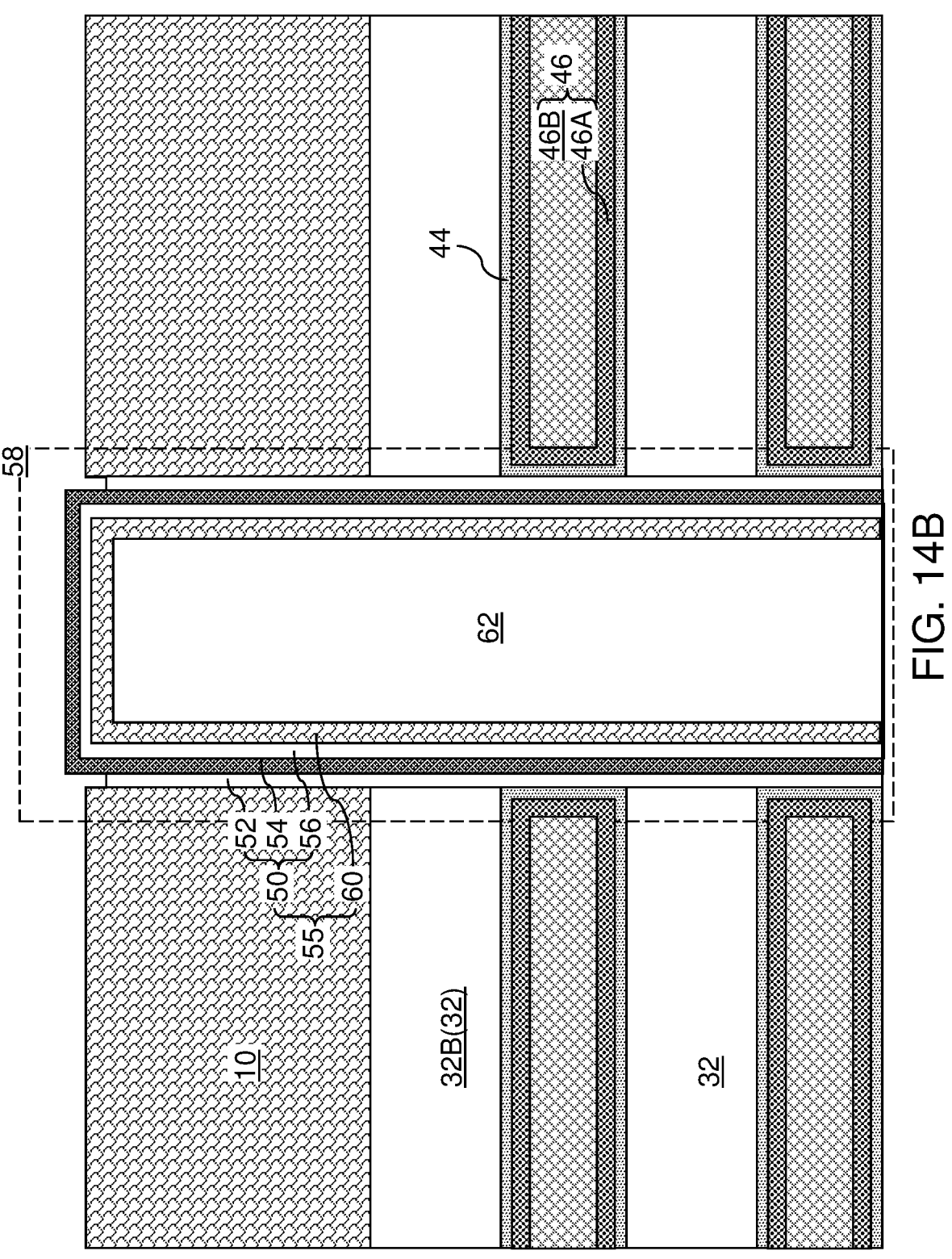

FIG. 14B is a magnified view of region B in FIG. 14A.

Figure 15A:
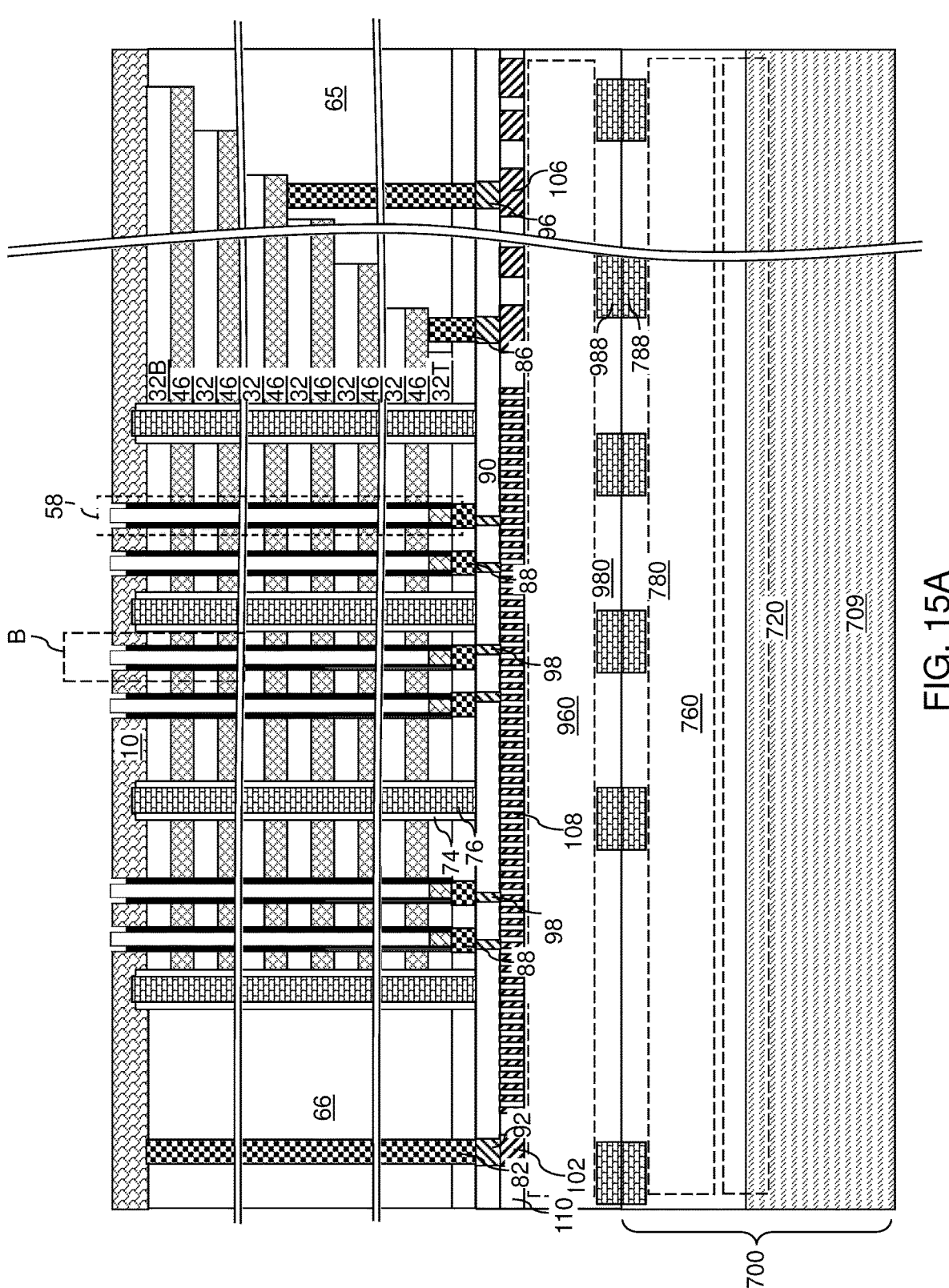

FIG. 15A is a vertical cross-sectional view of the exemplary structure after recessing end portions of the memory films according to an embodiment of the present disclosure.

Figure 15B:
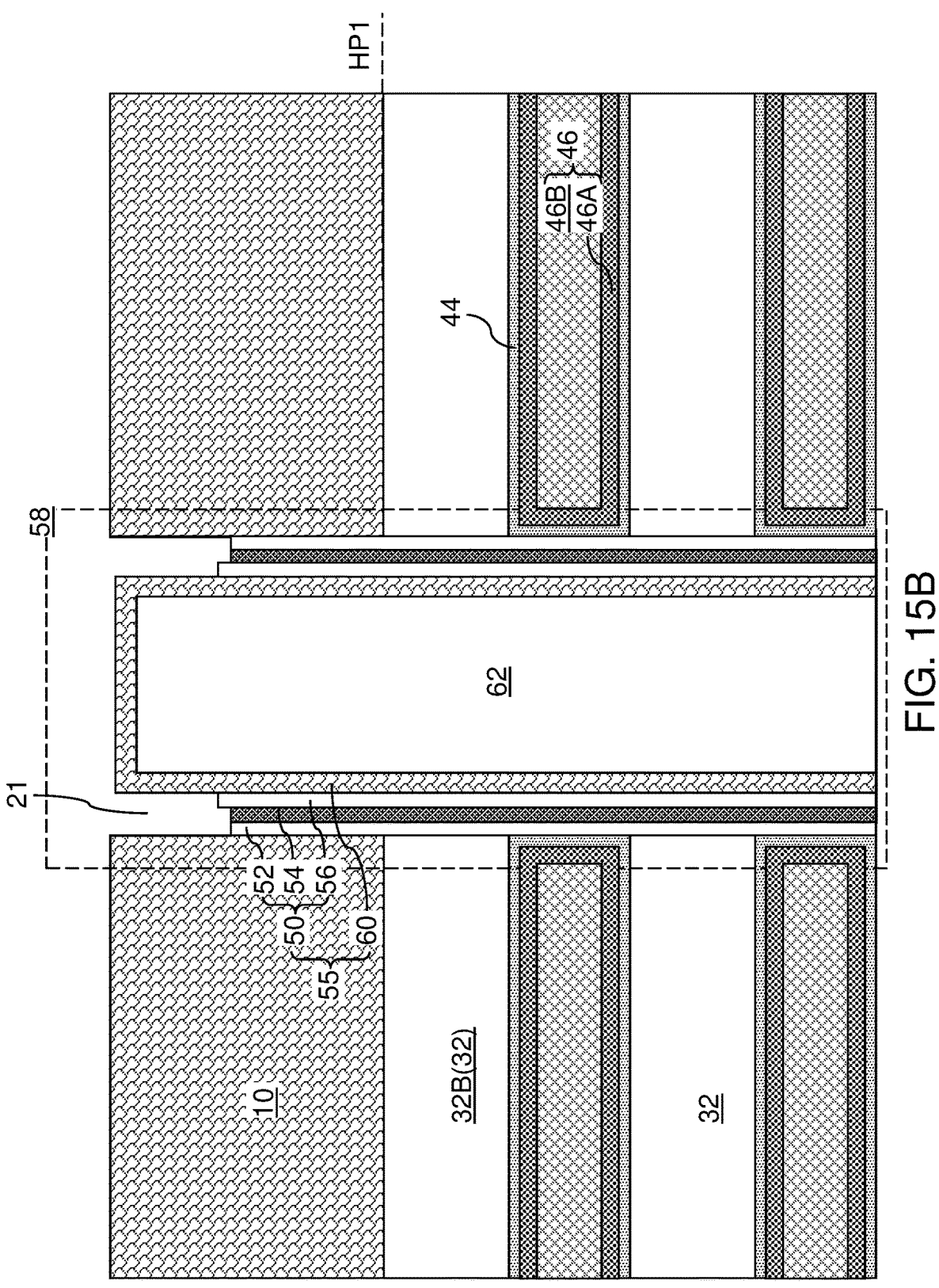

FIG. 15B is a magnified view of region B in FIG. 15A.

Figure 16A:
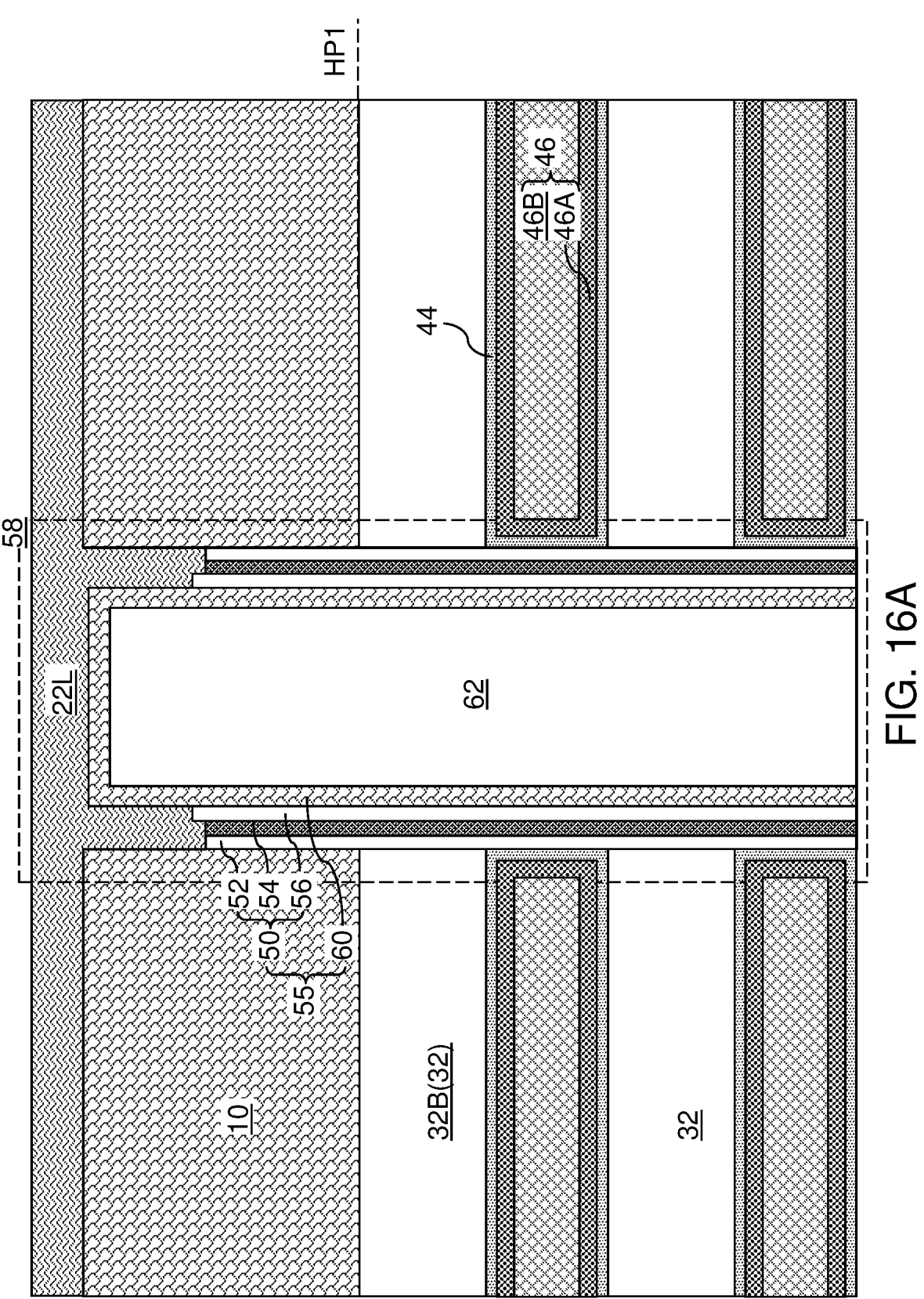
Figure 16B:
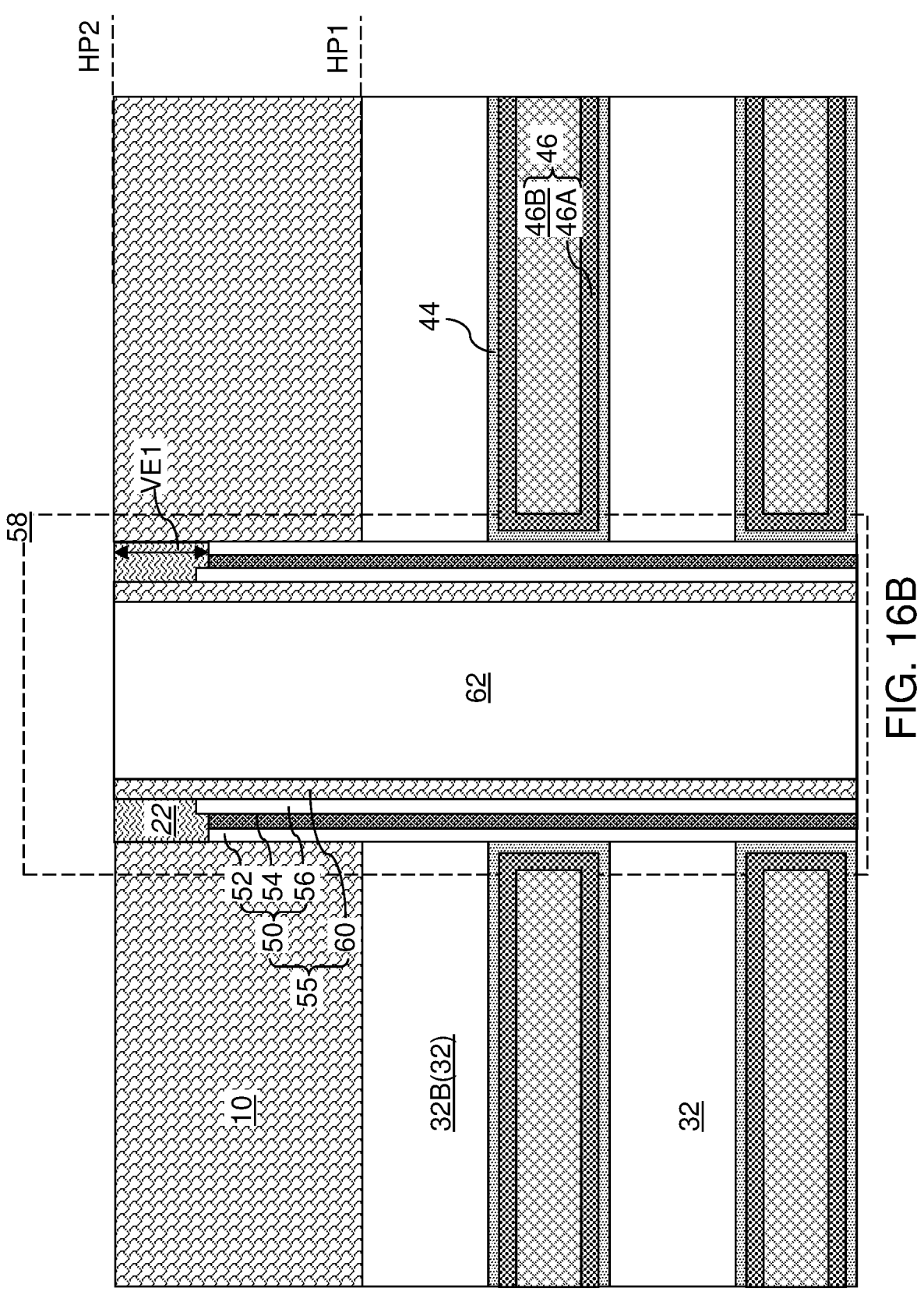
Figure 16C:
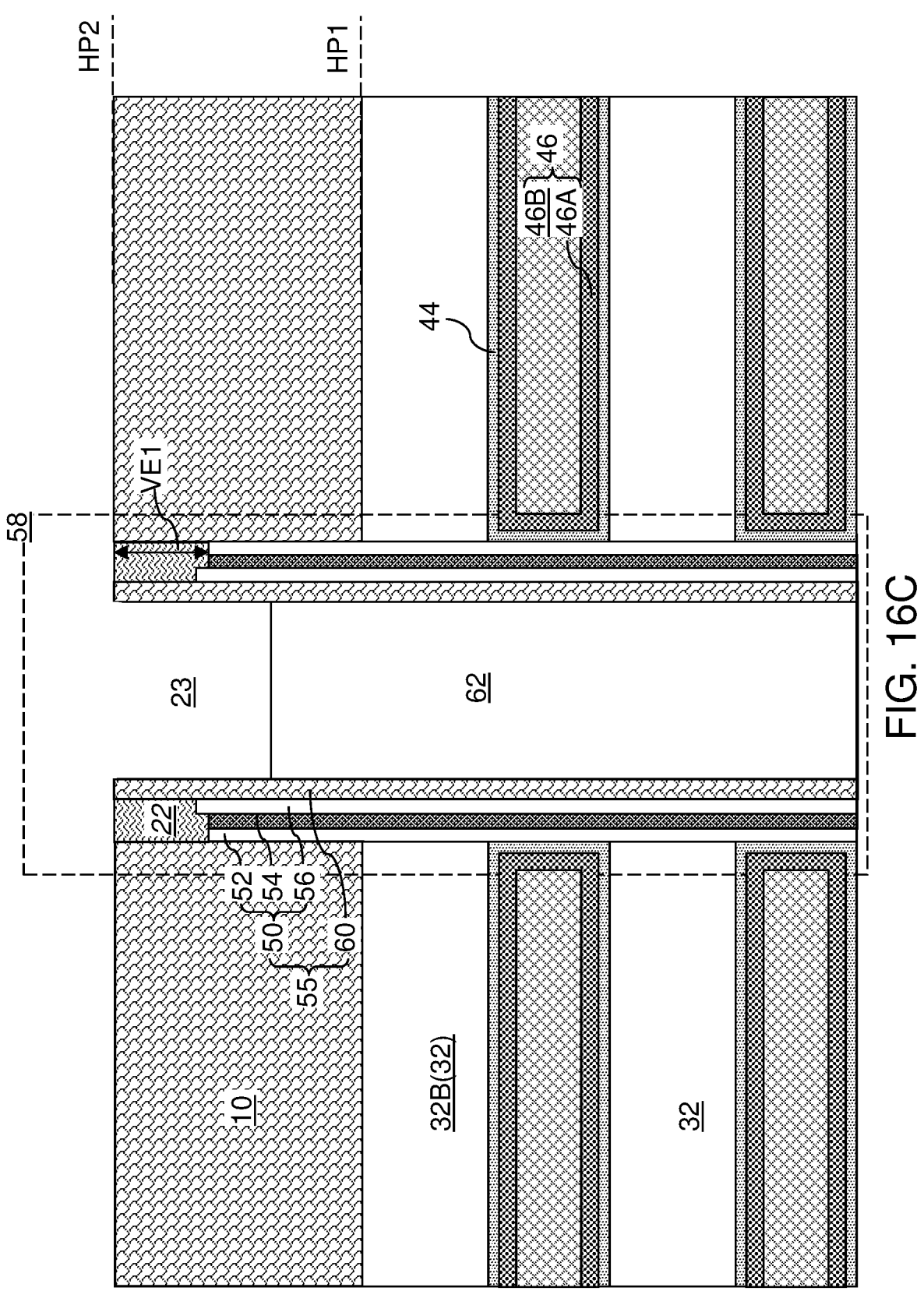

FIGS. 16A-16C are sequential vertical cross-sectional views of a region of the exemplary structure during formation of a tubular source strap and vertical recessing of an end portion of a dielectric core according to an embodiment of the present disclosure.

Figure 17A:
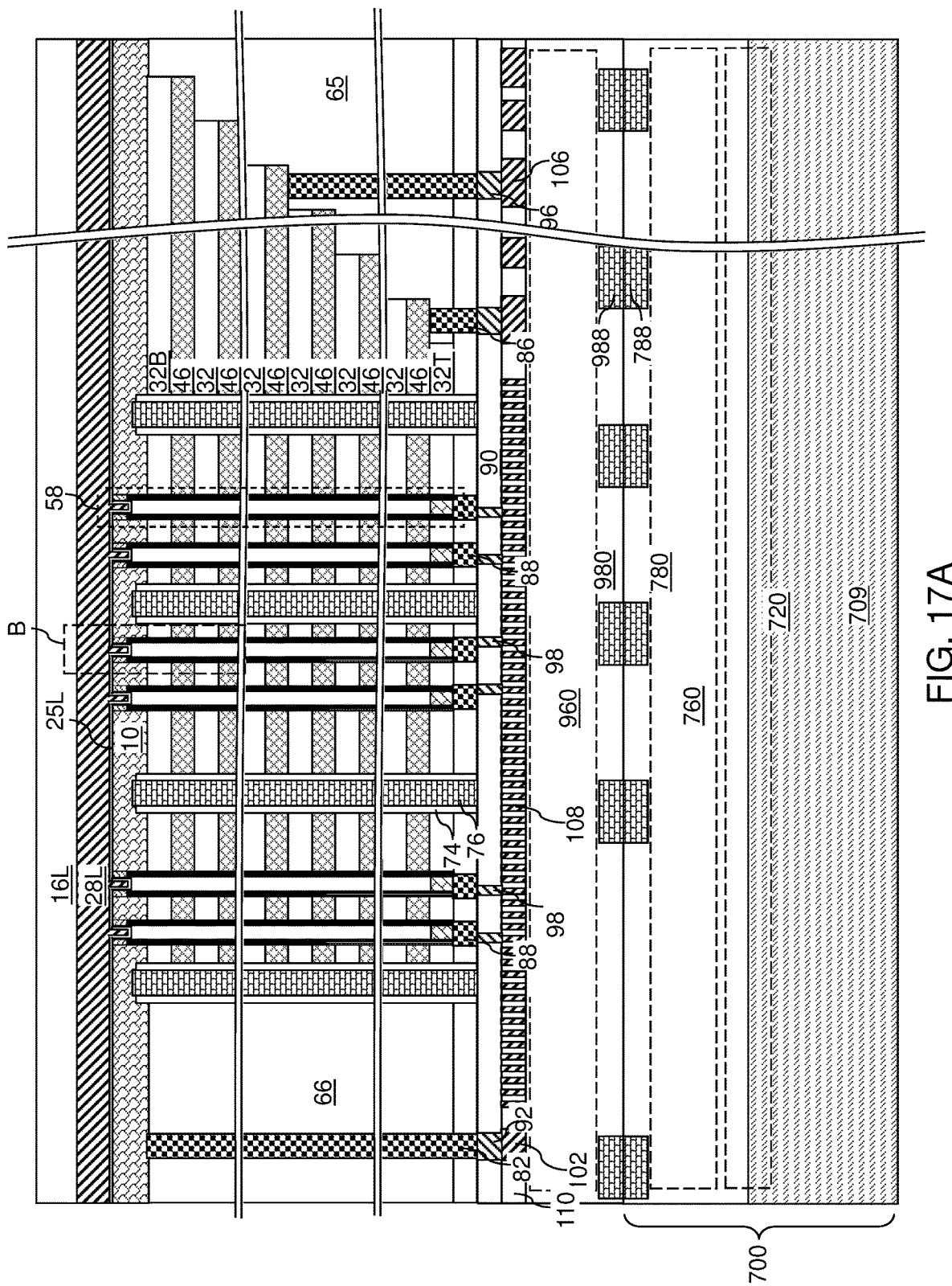

FIG. 17A is a vertical cross-sectional view of the exemplary structure after formation of a source-control-gate dielectric layer, a source-control electrode layer, and a cover dielectric layer according to an embodiment of the present disclosure.

Figure 17B:
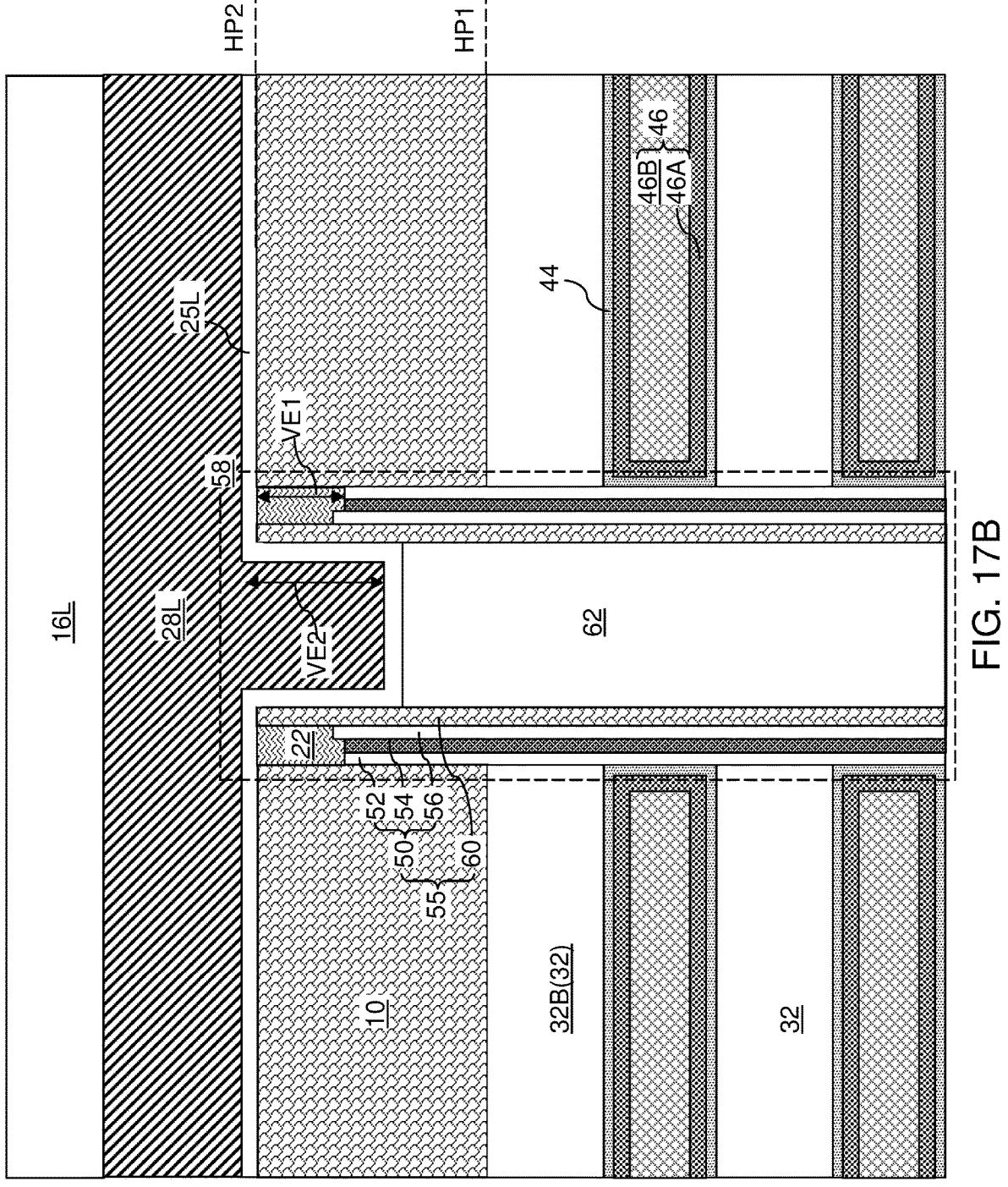

FIG. 17B is a magnified view of region B in FIG. 17A.

Figure 18:
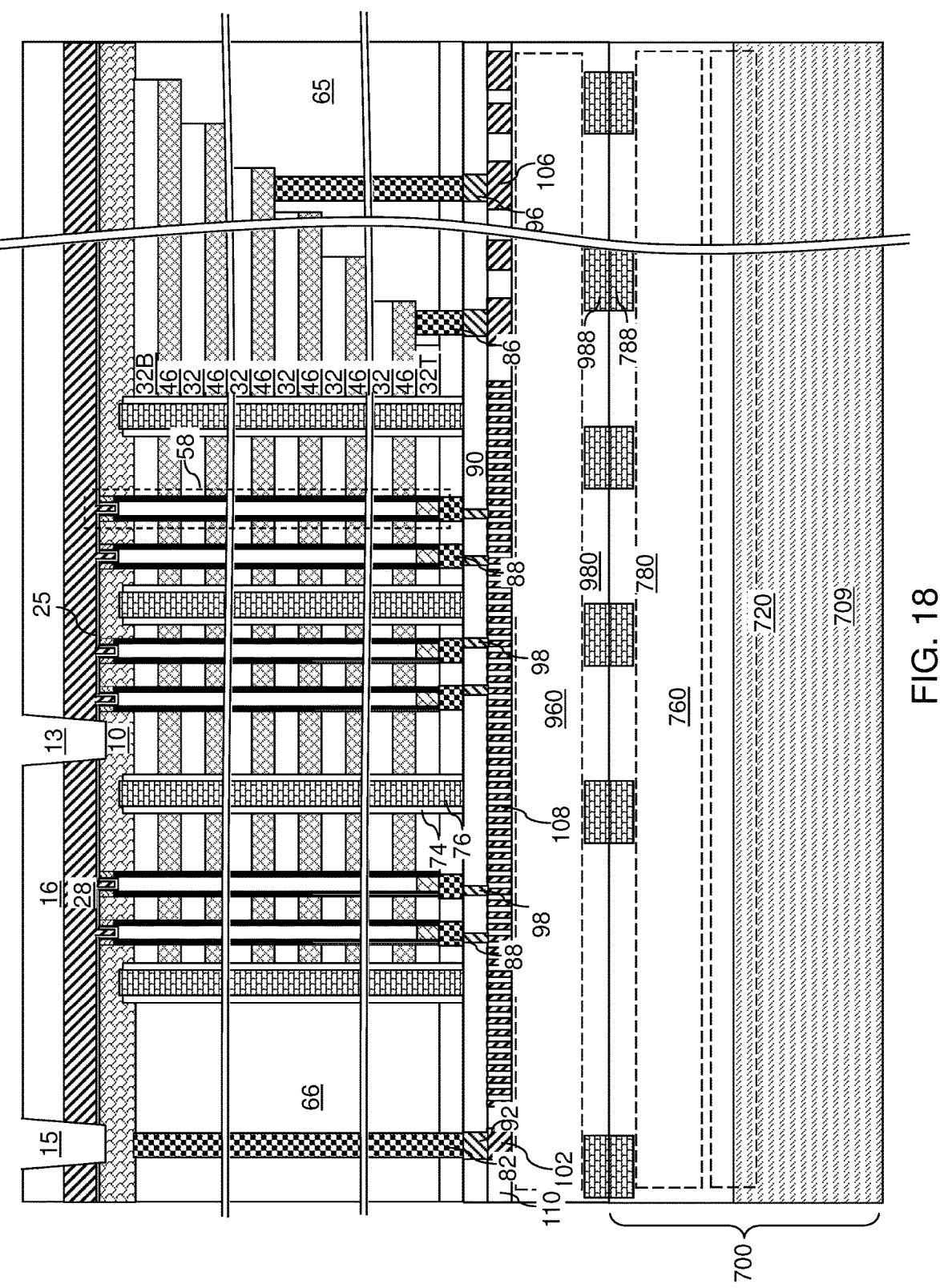

FIG. 18 is a vertical cross-sectional view of the exemplary structure after formation of contact via cavities according to an embodiment of present disclosure.

Figure 19:
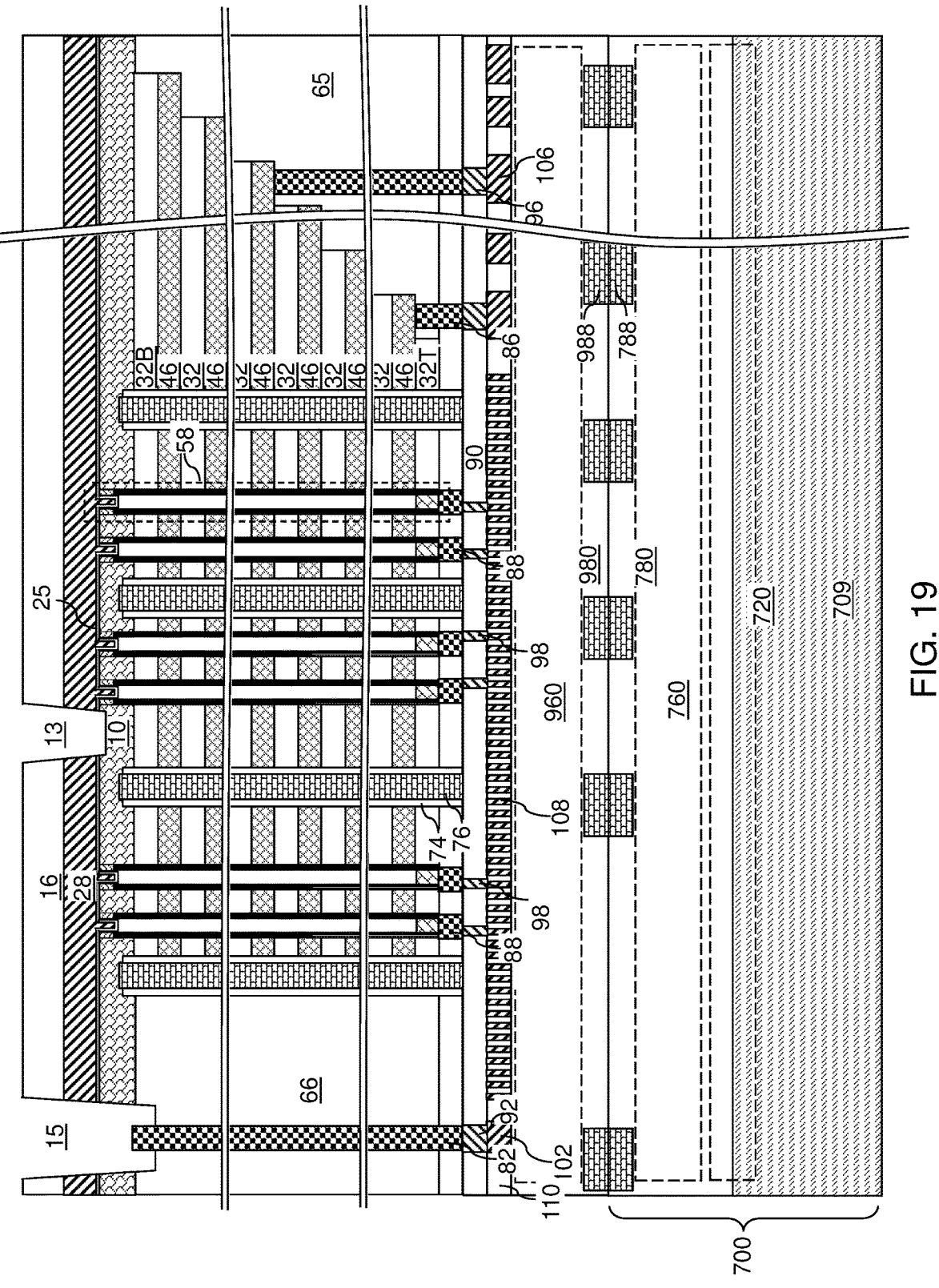

FIG. 19 is a vertical cross-sectional view of the exemplary structure after vertical extension of a subset of the contact via cavities according to an embodiment of present disclosure.

Figure 20:
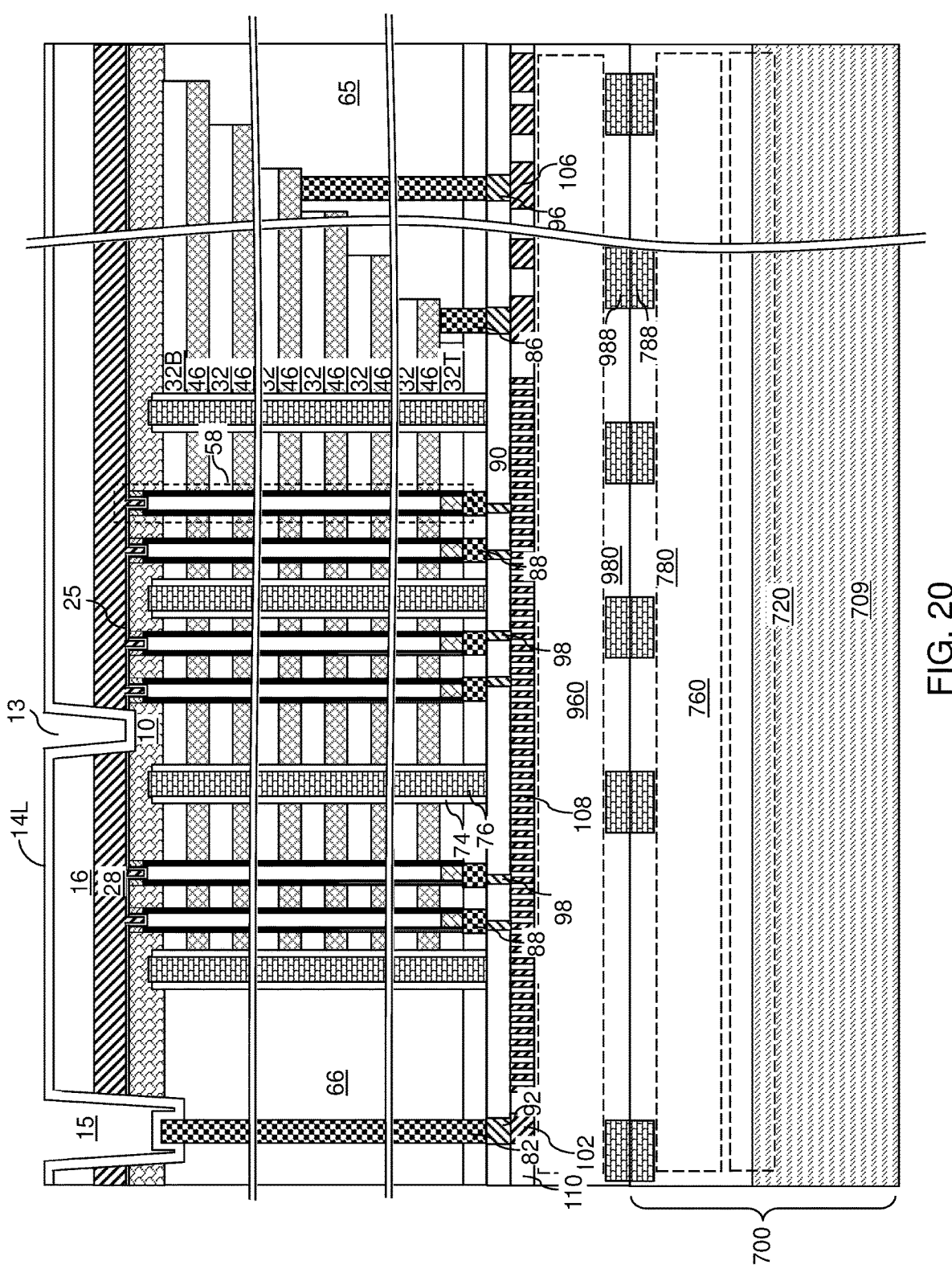

FIG. 20 is a vertical cross-sectional view of the exemplary structure after formation of an insulating spacer material layer according to an embodiment of present disclosure.

Figure 21:
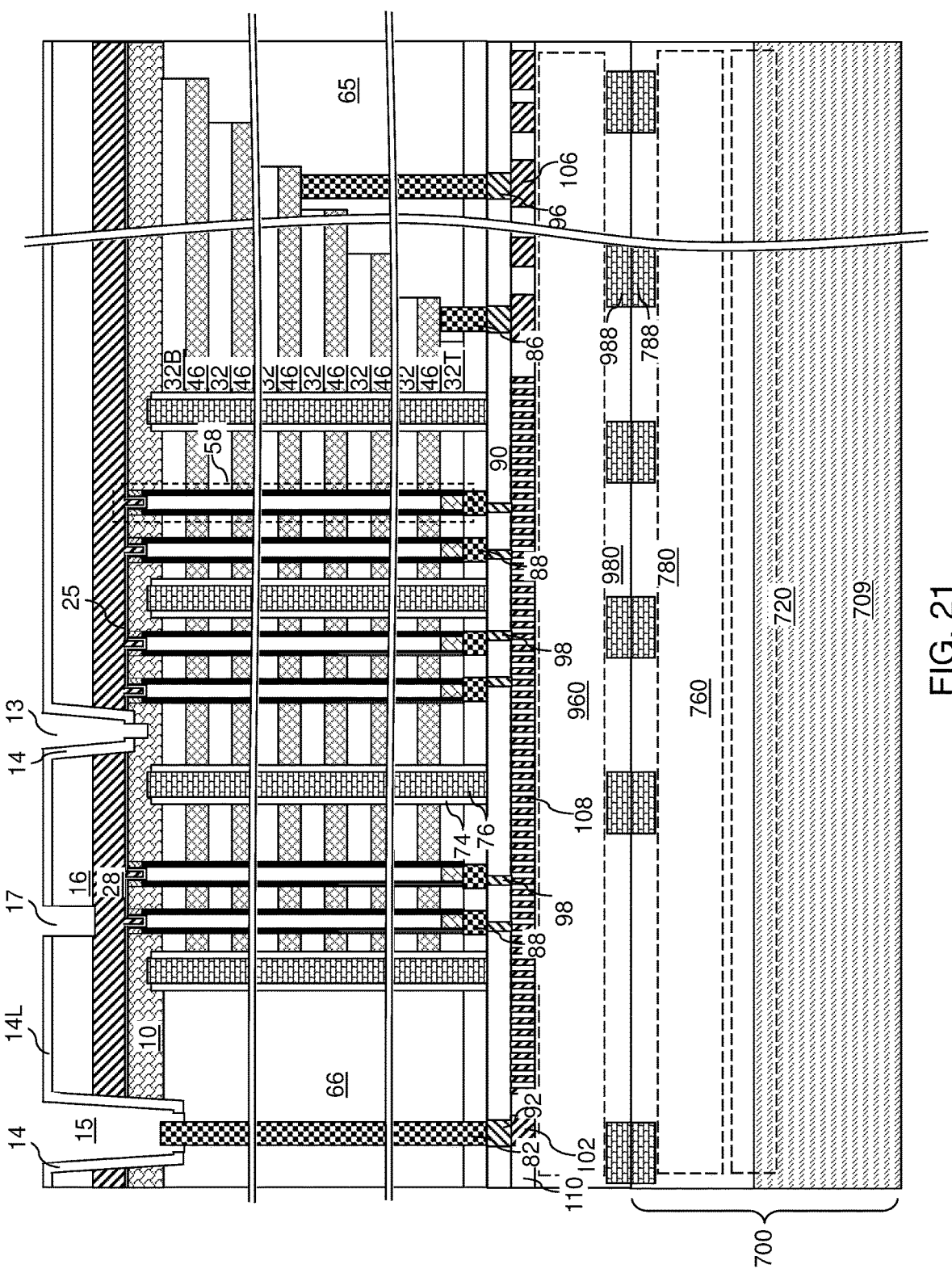

FIG. 21 is a vertical cross-sectional view of the exemplary structure after formation of insulating spacers according to an embodiment of present disclosure.

Figure 22:
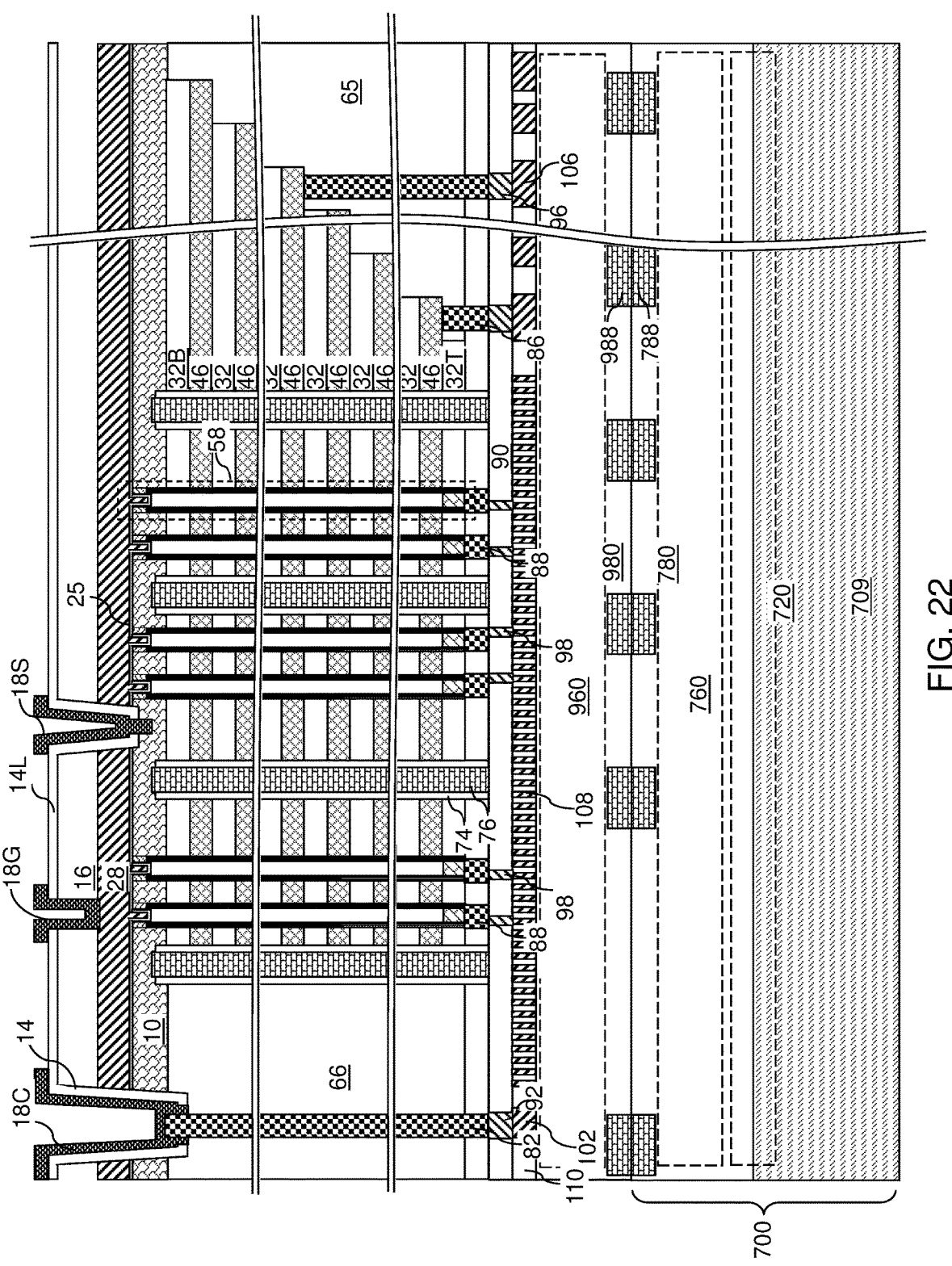

FIG. 22 is a vertical cross-sectional view of the exemplary structure after formation of various bonding pads according to an embodiment of present disclosure.

Figure 23A:
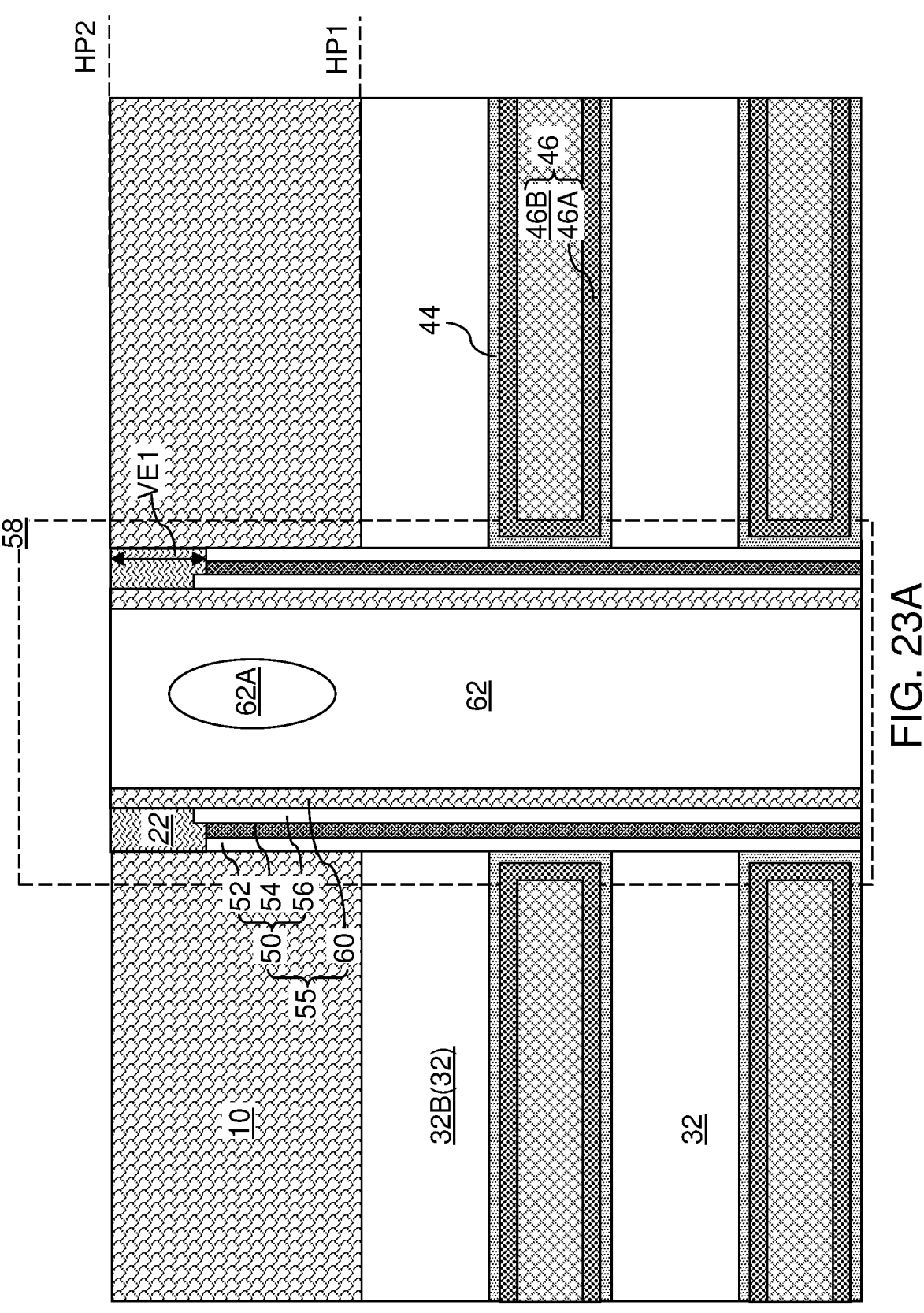
Figure 23B:
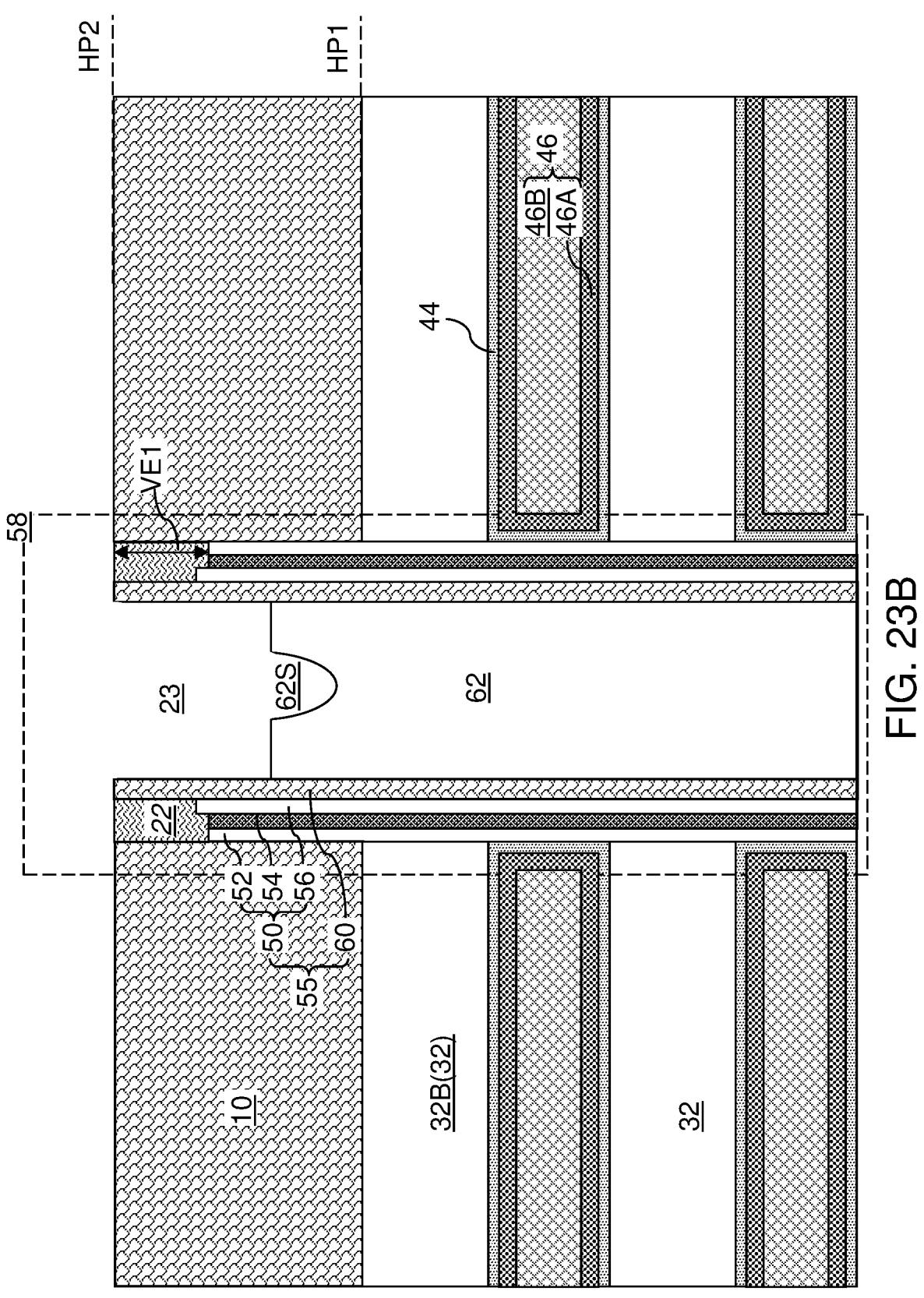
Figure 23C:
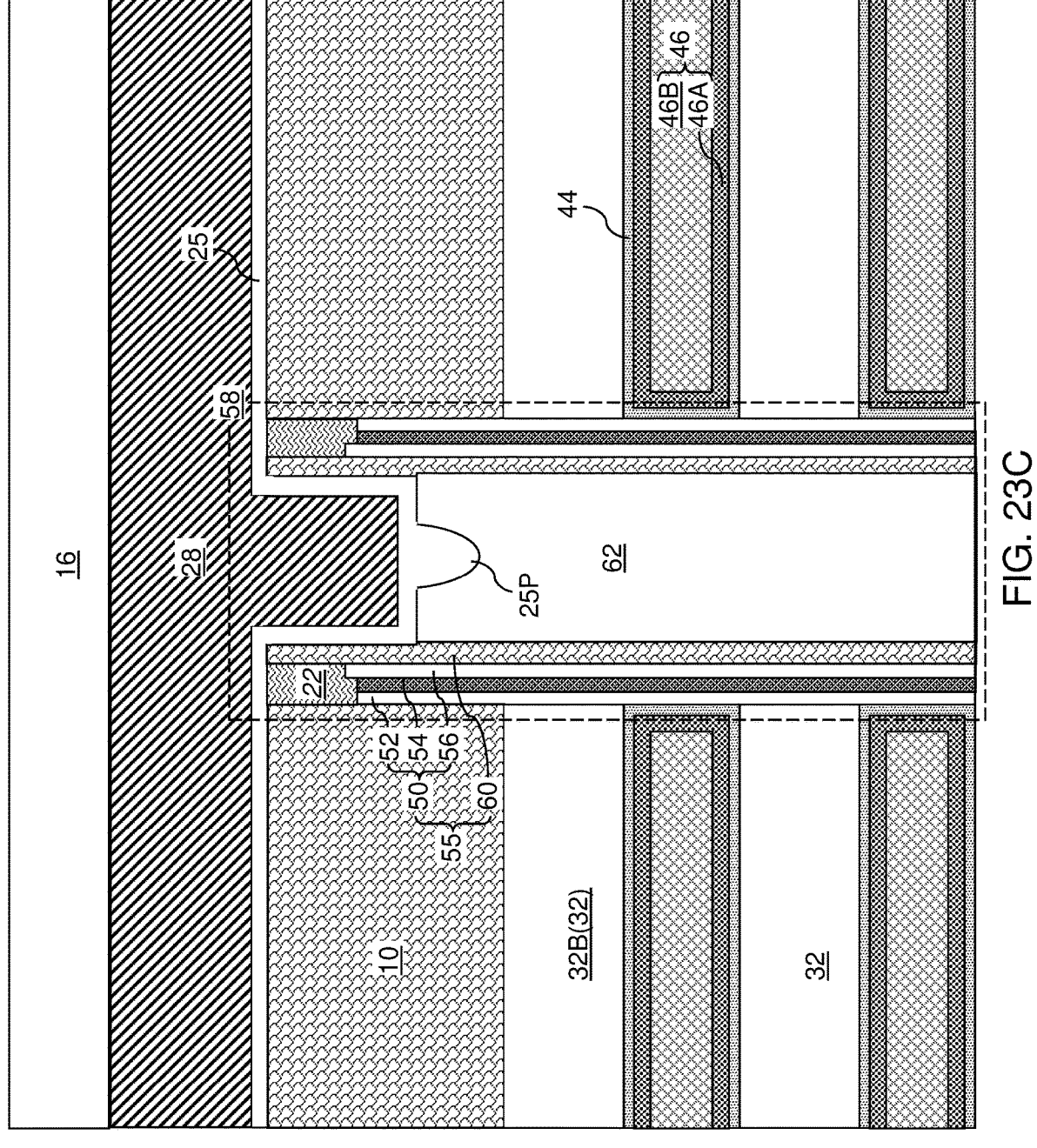

FIGS. 23A-23C are sequential vertical cross-sectional views of a region of an alternative exemplary structure according to an alternative embodiment of the present disclosure.

DETAILED DESCRIPTION

As discussed above, the present disclosure is directed to a three-dimensional memory device containing an insulated gate located over a top source layer for applying gate induced drain leakage (GIDL) erase voltage and methods for manufacturing the same, the various aspects of which are described below. Embodiments of the disclosure can be employed to form various structures including a multilevel memory structure, non-limiting examples of which include semiconductor devices such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Figure 1:
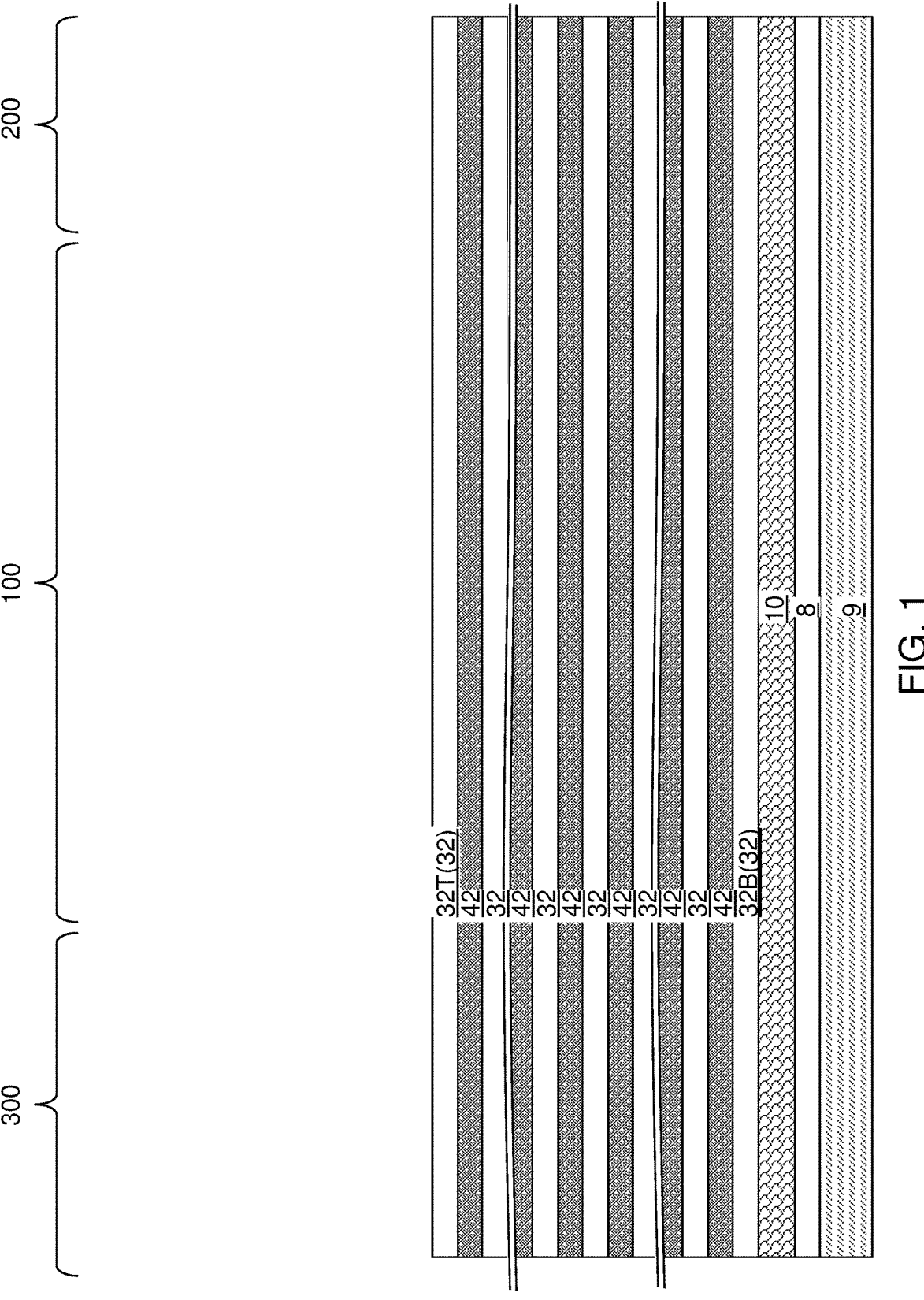
FIG. 1 is a schematic vertical cross-sectional view of an exemplary structure after formation of a backside sacrificial dielectric layer, a source layer, and an alternating stack of insulating layers and sacrificial material layers over a carrier substrate according to an embodiment of the present disclosure.

Referring to FIG. 1, an exemplary structure according to an embodiment of the present disclosure is illustrated, which comprises a carrier substrate 9, a backside sacrificial dielectric layer 8, a source layer 10, and an alternating stack (32, 46) of insulating layers 32 and sacrificial material layers 42. The carrier substrate 9 may comprise any substrate that can be employed to provide structural support during formation of a memory die thereupon. For example, the carrier substrate 9 may comprise a semiconductor substrate, an insulating substrate, a conductive substrate, or a combination thereof. In one embodiment, the carrier substrate 9 may comprise a commercially available single crystalline silicon wafer. The backside sacrificial dielectric layer 8 is optional, and can be employed as an etch stop layer and/or a protective pad layer during subsequent removal of the carrier substrate 9. For example, the backside sacrificial dielectric layer 8 may comprise silicon oxide, and may have a thickness in a range from 50 nm to 1,000 nm, although lesser and greater thicknesses may also be employed.

The source layer 10 comprises a semiconductor material (such as polysilicon, a silicon-germanium alloy, or a III-V compound semiconductor material) having a doping of an opposite conductivity type relative to the conductivity type of vertical semiconductor channels to be subsequently formed. If the vertical semiconductor channels have a doping of a first conductivity type, then the source layer 10 may have a doping of a second conductivity type that is the opposite of the first conductivity type. If the first conductivity type is p-type, the second conductivity type is n-type, and vice versa. The atomic concentration of dopants of the second conductivity type in the source layer 10 may be in a range from $5.0 \times 10^{18}/cm^3$ to $2.0 \times 10^{21}/cm^3$, such as from $1.0 \times 10^{20}/cm^3$ to $1.0 \times 10^{21}/cm^3$, although lesser and greater atomic concentrations may also be employed. The thickness of the source layer 10 may be in a range from 100 nm to 500 nm, although lesser and greater thicknesses may also be employed.

An alternating stack of insulating layers 32 and spacer material layers can be formed over the source layer 10. Generally, the spacer material layers are formed as, or are subsequently replaced with, electrically conductive layers. In one embodiment, the spacer material layers are formed as sacrificial material layers 42.

The insulating layers 32 comprise an insulating material such as a silicon-oxide-based insulating material. As used herein, a silicon-oxide-based insulating material refers to an insulating material including undoped silicate glass, a doped silicate glass, organosilicate glass, or silicon oxynitride with, or without, dopants therein. The sacrificial material layers 42 comprises a sacrificial material that can be removed selective to the insulating material of the insulating layers 32. As used herein, a removal of a first material is "selective to" a second material if the removal process removes the first material at a rate that is at least twice the rate of removal of the second material. The bottommost layer of the insulating layers 32 is herein referred to as a bottommost insulating layer 32B. The topmost layer of the insulating layers 32 is herein referred to as a topmost insulating layer 32T.

The insulating layers 32 comprise and/or consist essentially of the insulating material. Insulating materials that may be used for the insulating layers 32 include, but are not limited to silicon oxide (including doped or undoped silicate glass), silicon oxynitride, organosilicate glass (OSG), spin-on dielectric materials, etc. In one embodiment, the insulating layers 32 may consist essentially of a silicon oxide such as undoped silicate glass or a doped silicate glass.

The sacrificial material of the sacrificial material layers 42 may comprise an insulating material, a semiconductor material, or a conductive material. Non-limiting examples of the sacrificial material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride.

The insulating layers 32 and the sacrificial material layers 42 can be deposited, for example, by chemical vapor deposition (CVD). The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed.

While an embodiment is described in which the spacer material layers are formed as sacrificial material layers, embodiments are expressly contemplated herein in which the spacer material layers are formed as electrically conductive layers. In such embodiments, a set of processing steps described below with reference to replacement of the sacrificial material layers with electrically conductive layers can be omitted. The exemplary structure may comprise a memory array region 100 in which memory stack structures are to be subsequently formed, and a contact region 300 in which stepped surfaces and contact via structures are to be subsequently formed.

Referring to FIG. 2, stepped surfaces can be formed in the contact region 300 by patterning the alternating stack (32, 42). As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces. Upon formation of the stepped surfaces, the contact region 300 may be referred to as a staircase region.

The stepped cavity can have various stepped surfaces such that the horizontal cross-sectional shape of the stepped cavity changes in steps as a function of the vertical distance from the top surface of the substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer 42. In one embodiment, each vertical step can have the height of a single pair of an insulating layer 32 and a sacrificial material layer 42. In another embodiment, multiple "columns" of staircases can be formed along a first horizontal direction such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang.

The alternating stack (32, 42) can be removed in an area outside the memory array region 100 in a manner that forms a straight sidewall on the alternating stack (32, 42) adjacent to a peripheral region 200.

A dielectric material layer can be subsequently deposited. A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. A field dielectric material portion 66 can be formed in the peripheral region 200.

Referring to FIGS. 3A and 3B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings (not shown for clarity). As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings are formed through the retro-stepped dielectric material portion 65 and the portion of the alternating stack (32, 42) that underlie the stepped surfaces in the contact region 300.

A two-dimensional array of memory openings 49 can be formed in the memory array region 100. A two-dimensional array of support openings (not shown for clarity) can be formed in the contact region 300. A plurality of rows of memory openings 49 can be formed such that each row of memory openings 49 is arranged along a first horizontal direction hd1. The plurality of rows of memory openings 49 may be laterally spaced apart along a second horizontal direction hd2 that is perpendicular to the first horizontal direction hd1.

FIGS. 4A-4D are sequential vertical cross-sectional views of a memory opening 49 during formation of a memory opening fill structure 58 according to an embodiments of the present disclosure.

Figures 4A, 4B:
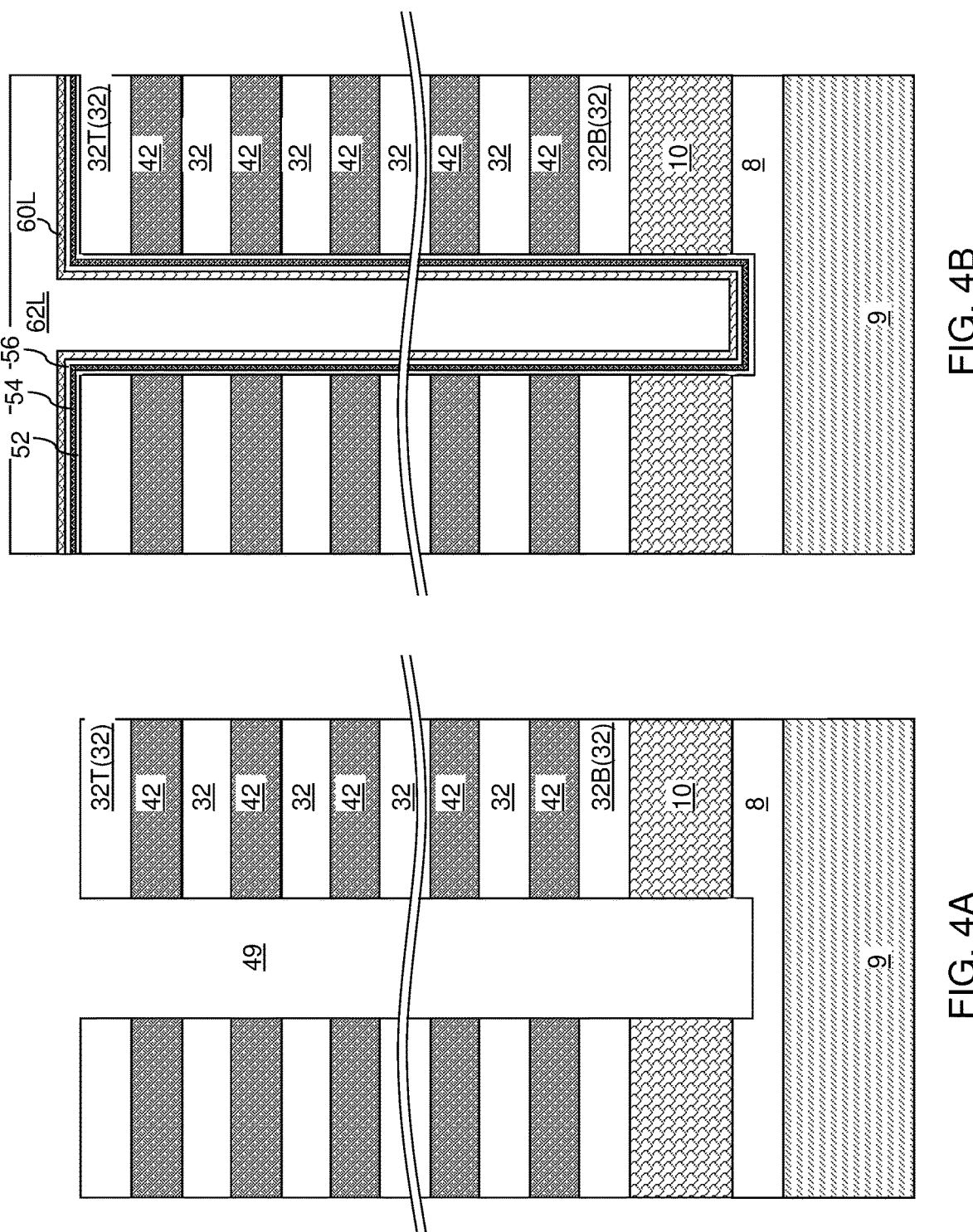

FIG. 4A illustrates a memory opening 49 after the processing steps of FIGS. 3A and 3B.

Referring to FIG. 4B, a stack of layers including a blocking dielectric layer 52, a memory material layer 54, and a dielectric liner 56 can be deposited on the physically exposed surfaces of the alternating stack (32, 42) in each memory opening 49 and in each support opening. The stack of layers is herein referred to as a memory film 50.

The blocking dielectric layer 52 can include a single dielectric material layer or a stack of a plurality of dielectric material layers. In one embodiment, the blocking dielectric layer 52 can include a dielectric metal oxide layer consisting essentially of a dielectric metal oxide. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous charge storage material layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer. Generally, the memory material layer 54 may comprise a vertical stack of memory elements that are located at levels of the sacrificial material layers 42. For example, the vertical stack of memory elements may be embodied as annular portions of the memory material layer 54 located at levels of the sacrificial material layers 42.

The optional dielectric liner 56, if present, comprises a dielectric liner material. In one embodiment, if the memory material layer 54 comprises a charge storage layer, then the dielectric liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed.

A semiconductor channel layer 60L can be deposited directly on the memory film 50. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon.

The semiconductor channel layer 60L can have a doping of a first conductivity type, which is the opposite of the conductivity type of the source layer 10. The atomic concentration of dopants of the first conductivity type in the semiconductor channel layer 60L may be in a range from $1.0 \times 10^{14}/cm^3$ to $3.0 \times 10^{17}/cm^3$, such as $3.0 \times 10^{15}/cm^3$ to $3.0 \times 10^{16}/cm^3$, although lesser and greater atomic concentrations may also be employed. The semiconductor channel layer 60L can be formed by a conformal deposition method such as low pressure chemical vapor deposition (LPCVD). The atomic concentration of dopants of the first conductivity type in the semiconductor channel layer 60L is lower than the atomic concentration of dopants of the second conductivity type in the source layer 10. The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

A dielectric core layer 62L can be deposited to fill any remaining portion of the memory cavity 49' within each memory opening 49. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figures 4C, 4D:
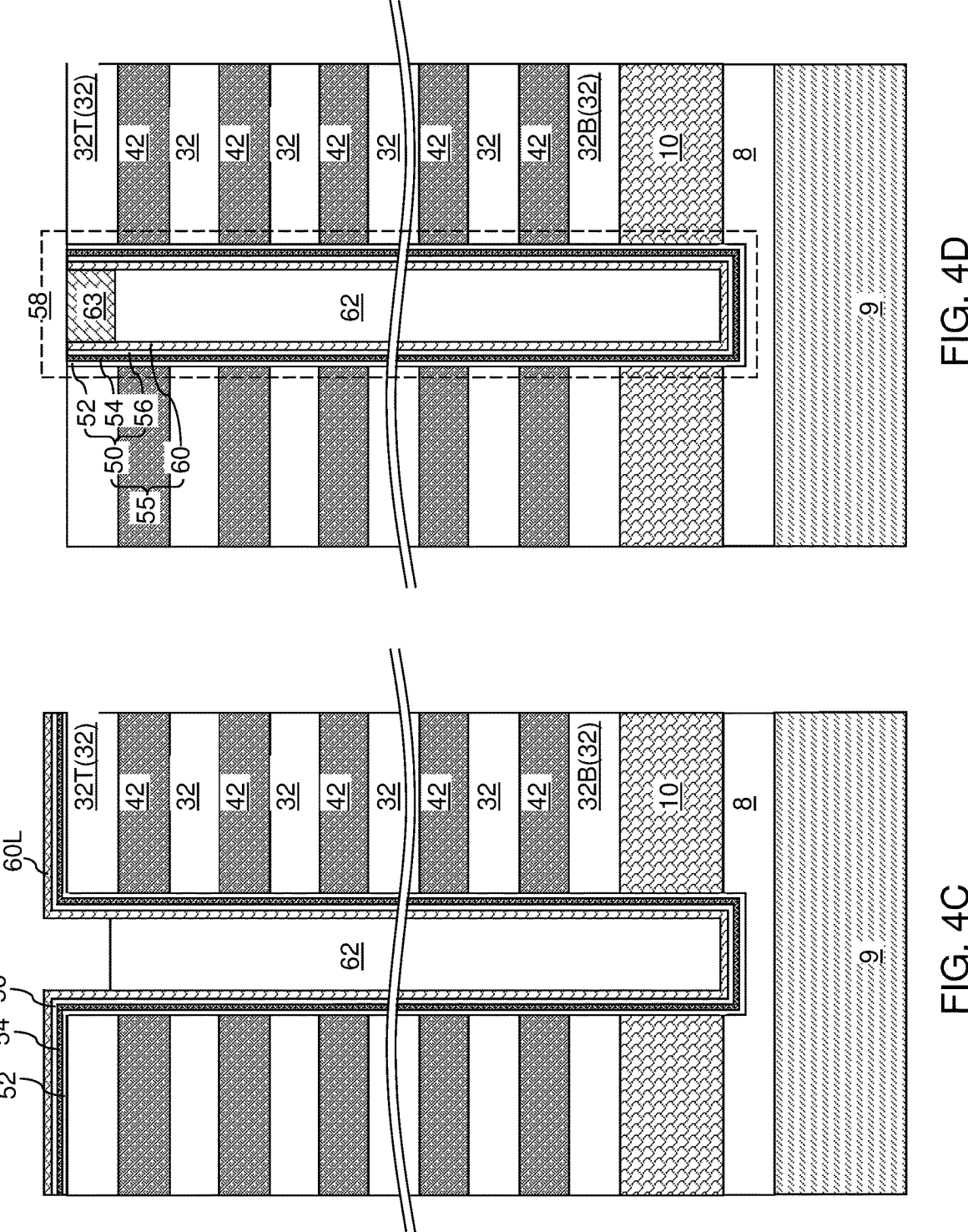

Referring to FIG. 4C, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the topmost insulating layer 32T. Each remaining portion of the dielectric core layer constitutes a dielectric core 62.

Referring to FIG. 4D, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each combination of a memory film 50 and a vertical semiconductor channel 60 within a memory opening 49 constitutes a memory stack structure 55. The memory stack structure 55 is a combination of a vertical semiconductor channel 60, an optional dielectric liner 56, a plurality of memory elements (comprising portions of the memory material layer 54 located at the levels of the sacrificial material layers 42), and the blocking dielectric layer 52. Each contiguous combination of a memory stack structure 55, a dielectric core 62, and a drain region 63 that fills a respective memory opening 49 is herein referred to as a memory opening fill structure 58. Each contiguous combination of a memory film 50, a vertical semiconductor channel 60, a dielectric core 62, and a drain region 63 that fills a respective support opening is herein referred to as a support pillar structure.

Referring to FIGS. 5A and 5B, the exemplary structure is illustrated after formation of memory opening fill structures 58 and support pillar structures (not shown for clarity) within the memory openings 49 and the support openings, respectively. An instance of a memory opening fill structure 58 can be formed within each memory opening 49 of the structure of FIGS. 3A and 3B. An instance of the support pillar structure can be formed within each support opening of the structure of FIGS. 3A and 3B.

Referring to FIGS. 6A and 6B, a contact-level dielectric layer 80 can be formed over the alternating stack (32, 42). A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), and the dielectric material portions (65, 66). Access trenches 79 laterally extending along the first horizontal direction hd1 can be formed through the alternating stack (32, 42), the dielectric material portions (65, 66), and the contact-level dielectric layer 80. Each of the access trenches 79 may comprise a respective pair of lengthwise sidewalls that are parallel to the first horizontal direction hd1 and vertically extend from the source layer 10 to the top surface of the contact-level dielectric layer 80. A top surface of the source layer 10 can be physically exposed underneath each access trench 79. The photoresist layer can be subsequently removed, for example, by ashing.

Referring to FIG. 7, an isotropic etch process can be performed to remove the sacrificial material layers 42 selective to the insulating layers 32, the memory opening fill structures 58, and the source layer 10. Backside recesses 43 can be formed in volumes from which the sacrificial material layers 42 are removed. Sidewall surface segments of the memory opening fill structures 58 can be physically exposed to the backside recesses 43. In an illustrative example, if the sacrificial material layers 42 comprise silicon nitride, then the isotropic etch process may comprise a wet etch process employing hot phosphoric acid, which is a process in which the exemplary structure is immersed in phosphoric acid at, or near, the boiling point of the phosphoric acid. A suitable clean process may be performed as needed.

Referring to FIG. 8, a backside blocking dielectric layer (not shown) can be optionally formed in the backside recesses 43 by a conformal deposition process. At least one conductive material, such as at least one metallic material, can be conformally deposited in the backside recesses 43. The at least one conductive material may comprise, for example, a combination of a metallic barrier material and a metallic fill material. The metallic barrier material may comprise, for example, TiN, TaN, WN, MoN, TiC, TaC, WC, or a combination thereof. The metallic fill material may comprise, for example, Ti, Ta, Mo, Co, Ru, W, Cu, other transition metals, and/or alloys or layer stacks thereof. Excess portions of the at least one conductive material that are deposited in the access trenches 79 or above the contact-level dielectric layer 80 can be removed by performing an etch-back process, which may comprise an isotropic etch process and/or an anisotropic etch process. Each remaining portion of the at least one conductive material filling a respective one of the backside recesses 43 constitutes an electrically conductive layer 46. An alternating stack of insulating layers 32 and electrically conductive layers 46 can be formed between each neighboring pair of access trenches 79 over the carrier substrate 8. A plurality of alternating stacks of insulating layers 32 and electrically conductive layers 46 can be laterally spaced apart among one another by the access trenches 79.

Referring to FIG. 9, at least one dielectric fill material such as silicon oxide, and at least one electrically conductive material, such as tungsten, can be deposited in the access trenches 79 to form access trench fill structures (74, 76). In one embodiment, each of the access trench fill structures (74, 76) may comprise a combination of an insulating spacer 74 and a trench contact via structure (i.e., local interconnect) 76 that is laterally surrounded by the insulating spacer 74.

Referring to FIGS. 10A and 10B, a photoresist layer (not shown) can be applied over the contact-level dielectric layer 80, and can be lithographically patterned to form openings therethrough. An anisotropic etch process can be performed to transfer the pattern of the openings in the photoresist layer through the contact-level dielectric layer 80 and optionally through the dielectric material portions (65, 66). Various contact via cavities can be formed through the contact-level dielectric layer 80 and the dielectric material portions (65, 66). The photoresist layer can be subsequently removed, for example, by ashing.

At least one conductive material, such as a combination of a metallic barrier material and a metallic fill material, can be deposited in the contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the various contact via cavities constitute various contact via structures (86, 88, 82). The various contact via structures (86, 88, 82) may comprise layer contact via structures 86 vertically extending through the contact-level dielectric layer 80 and the retro-stepped dielectric material portion 65 and contacting a respective one of the electrically conductive layers 86, drain contact via structures 88 contacting a top surface of a respective one of the drain regions 63, and through-memory-level-via structures 82 that vertically extend through the contact-level dielectric layer 80 and the field dielectric material portion 66 and contacting a top surface of the source layer 10.

Referring to FIGS. 11A and 11B, a connection-level dielectric layer 90 can be formed over the contact-level dielectric layer 80 by deposition of a dielectric material such as silicon oxide. Connection via structures (98, 96, 92) can be formed through the connection-level dielectric layer 90 on a respective one of the contact via structures (86, 88, 82). For example, bit-line-connection via structures 98 can be formed on the drain contact via structures 88, layer connection via structures 96 can be formed on the layer contact via structures 86, and peripheral connection via structures 92 that are formed on through-memory-level-via structures 82.

A line-level dielectric layer can be formed over the connection-level dielectric layer 90. The line-level dielectric layer is herein referred to as a bit-line-level dielectric layer 110 or a first-metal-line-level dielectric layer 110. First-level metal lines (108, 106, 102) can be formed in the bit-line-level dielectric layer 110. The first-level metal lines (108, 106, 102) may include bit lines 108, first word-line-connection metal lines 106, and first peripheral-connection metal lines 102. The bit lines 108 can be parallel to each other and can laterally extend along the second horizontal direction (i.e., bit line direction) hd2 that is perpendicular to the lengthwise direction of the access trench fill structures 76. For example, if the access trench fill structures 76 laterally extend along the first horizontal direction (i.e., word line direction) hd1, the bit lines 108 may laterally extend along the second horizontal direction hd2.

Each bit line 108 can be electrically connected to a respective subset of the drain regions 63 through a respective subset of the drain contact via structures 88 and a respective subset of the bit-line-connection via structures 98. The first word-line-connection metal lines 106 can be formed in contact with the layer connection via structures 96. The first peripheral-connection metal lines 108 can be formed in contact with the peripheral connection via structures 92.

Referring to FIG. 12, additional dielectric material layers 960 and additional metal interconnect structures 980 can be formed over the bit-line-level dielectric layer 110. The additional dielectric material layers may include at least one via-level dielectric layer, at least one additional line-level dielectric layer, and/or at least one additional line-and-via-level dielectric layer. The additional metal interconnect structures 980 may comprise metal via structures, metal line structures, and/or integrated metal line-and-via structures. Metal bonding pads, which are herein referred to as memory-side bonding pads 988, may be formed at the topmost level of the additional dielectric material layers 960. The memory-side bonding pads 988 may be electrically connected to the additional metal interconnect structures 980 and various nodes of the three-dimensional memory array including the electrically conductive layers 46 and the memory opening fill structures 58.

The set of all metal interconnect structures formed in or above the contact-level dielectric layer 80 is herein referred to as memory-side metal interconnect structures (88, 86, 82, 98, 96, 92, 102, 106, 108, 980). The set of all dielectric material layers formed above the alternating stacks (32, 46) is herein referred to as memory-side dielectric material layers (80, 90, 110, 960). The memory-side bonding pads 988 can be electrically connected to the memory-side metal interconnect structures (88, 86, 82, 98, 96, 92, 102, 106, 108, 980). A memory die 900 includes all layers between the source layer 10 and the memory-side bonding pads 988.

In addition, a logic die 700 can be provided. The logic die 700 includes a logic-side substrate 709, a peripheral circuit 720 located on the logic-side substrate 709 and comprising logic-side semiconductor devices (such as field effect transistors), logic-side metal interconnect structures 780 embedded within logic-side dielectric material layers 760, and logic-side bonding pads 778. The peripheral circuit 720 can be configured to control operation of the memory array within the memory die 900. Specifically, the peripheral circuit 720 can be configured to drive various electrical components within the memory array including, but not limited to, the electrically conductive layers 46, the drain regions 63, and the source layer 10. The peripheral circuit 720 can be configured to control operation of the vertical stack of memory elements in the memory array in the memory die 900.

The logic die 700 can be attached to the memory die 900, for example, by bonding the logic-side bonding pads 778 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Referring to FIGS. 13A and 13B, the carrier substrate 9 can be removed, for example, by grinding, polishing, cleaving, an isotropic etch process, and/or an anisotropic etch process. The distal of the backside sacrificial dielectric layer 8 can be physically exposed. As used herein, a distal side of an element in a bonded assembly refers to a side that is distal from a horizontal plane including a bonding interface 800 of the bonded assembly.

In one embodiment shown in FIG. 13B, an optional backside blocking dielectric layer 44 may be present between neighboring pairs of an insulating layer 32 and an electrically conductive layer 46. In some embodiments, each electrically conductive layer 46 may comprise a combination of a metallic barrier liner 46A including a metallic barrier material (such as TiN, TaN, WN, MoN, TiC, TaC, WC, etc.) and a metallic fill material portion 46B including a metallic fill material (such as W, Ti, Ta, Co, Ru, Mo, Cu, etc.).

Referring to FIGS. 14A and 14B, the backside sacrificial dielectric layer 8 can be removed above the horizontal plane including the distal horizontal surface of the source layer 10. The backside sacrificial dielectric layer 8 can be removed by a chemical mechanical polishing process and/or by an etch process such as a wet etch process or a reactive ion etch process. In one embodiment, the backside sacrificial dielectric layer 8 can be removed selective to the materials of the source layer 10 and one of the layers in each memory film 50 (such as a memory material layer 54). In an illustrative example, the backside sacrificial dielectric layer 8 can include a silicon oxide material, and a wet etch process employing dilute hydrofluoric acid may be employed to remove portions of the backside sacrificial dielectric layer 8 that is proximal to the source layer 10. In case the blocking dielectric layer 52 comprises silicon oxide and the memory material layer 54 comprises silicon nitride, then the wet etch process can be selective to the material of the memory material layer 54. In one embodiment, the blocking dielectric layer 52 can be collaterally etched during the wet etch process, and a surface of the memory material layer 54 may be physically exposed.

Referring to FIGS. 15A and 15B, a series of wet etch processes can be performed to etch through horizontally-extending portions of each memory film 50 such that a horizontal surface of a distal end portion of each vertical semiconductor channel 60 is physically exposed. A tubular cavity 21 can be formed in each volume from which a vertically-extending portion of a memory film 50 is removed. Each the tubular cavity 21 can be formed by performing at least one etch process that etches a distal end portion of the memory film 50 selective to materials of the source layer 10 and the vertical semiconductor channel 60. Generally, each tubular cavity 21 can be formed by removing a portion of a respective memory film 50 that is proximal to a distal horizontal surface of the source layer 10 that is not in contact with the alternating stack (32, 46). Physically exposed recessed surfaces of the memory films 50 can be located between a first horizontal plane HP1 including a proximal surface of the source layer 10 and a horizontal plane including a distal surface of the source layer 10. The proximal surface of the source layer 10 can contact a surface of the alternating stack (32, 46), such as a horizontal surface of a most distal insulating layer 32 within the alternating stack (32, 46) (such as a bottommost insulating layer 32B) from the bonding interface 800.

Referring to FIG. 16A, a semiconductor fill material layer 22L can be formed in the tubular cavities 21 and over the distal horizontal surface of the source layer 10. The semiconductor fill material layer 22L includes a semiconductor material such as polysilicon or amorphous silicon. The thickness of the semiconductor fill material layer 22L is selected such that the tubular cavities 21 are filled with the semiconductor fill material layer 22L. The semiconductor fill material layer 22L may be deposited, for example, by chemical vapor deposition.

The semiconductor fill material layer 22L may be intrinsic, or may be doped with dopants of the first conductivity type, or may be doped with dopants of the second conductivity type. In case the semiconductor fill material layer 22L includes dopants, then the atomic concentration of dopants within the semiconductor fill material layer 22L is lower than the atomic concentration of dopants in the source layer 10, and may be lower than the atomic concentration of dopants in the vertical semiconductor channel 60. In one embodiment, the atomic concentration of dopants within the semiconductor fill material layer 22L may be in a range from $1.0 \times 10^{14}/cm^3$ to $3.0 \times 10^{17}/cm^3$, such as $1.0 \times 10^{15}/cm^3$ to $3.0 \times 10^{16}/cm^3$ and/or $3.0 \times 10^{15}/cm^3$ to $1.0 \times 10^{16}/cm^3$, although lesser and greater atomic concentrations may also be employed. Generally, the source layer 10 comprises dopants of the second conductivity type at a higher atomic concentration than dopants within the vertical semiconductor channel 60 and than dopants within the semiconductor fill material layer 22L.

Referring to FIG. 16B, the horizontally-extending portion of the semiconductor fill material layer 22L overlying the source layer 10, a distal portion of the source layer 10, and an end portion of each vertical semiconductor channel 60 that overlie a second horizontal plane HP2 can be removed by performing a planarization process. The planarization process may comprise a chemical mechanical polishing (CMP) process and/or a recess etch process. Each remaining portion of the semiconductor fill material layer 22L that fills a respective tubular cavity 21 comprises a tubular source strap 22. A tubular source strap 22 can be formed in each tubular cavity 21. A horizontally-extending portion of each vertical semiconductor channel 60 can be removed during the planarization process, and each of the dielectric cores 62 can be physically exposed. The physically exposed horizontal surfaces of the dielectric cores 62 are herein referred to as distal surfaces of the dielectric cores 62 which are distal from the bonding interface 800.

In one embodiment, each interface between a memory film 50 and a tubular source strap 22 is formed entirely between the first horizontal plane HP1 including the horizontal interface between the source layer 10 and the alternating stack (32, 46) and the second horizontal plane HP2 that includes a distal surface of the source layer HP2. In one embodiment, an annular end surface of each tubular source strap 22 can be located within the second horizontal plane HP2. In one embodiment, each tubular source strap 22 has a same lateral thickness as the memory film 50 that is contacted by the tubular source strap 22. The tubular source strap 22 has a first vertical extent VE1 that is less than the thickness of the source layer 10, i.e., less than the distance between the first horizontal plane HP1 and the second horizontal plane HP2.

Each memory opening 49 can be filled with a combination of a tubular source strap 22, a memory film 50, a vertical semiconductor channel 60, a dielectric core 62, and a drain region 63. As such, each memory opening fill structure 58 comprises a combination of a tubular source strap 22, a memory film 50, a vertical semiconductor channel 60, a dielectric core 62, and a drain region 63. In one embodiment, the memory film 50 comprises a layer stack including a blocking dielectric layer 52, a memory material layer 54 which comprises a charge storage layer and a dielectric liner 56 which comprises a tunneling dielectric layer. The vertical semiconductor channel 60 comprises a first semiconductor material having a doping of a first conductivity type. The tubular source strap 22 comprises a second semiconductor material, is located on a first (i.e., distal) end portion of the memory film 50, and laterally surrounds and contacts a first (i.e., distal) end portion of the vertical semiconductor channel 60. The dielectric core 62 is laterally surrounded by the vertical semiconductor channel 60.

Referring to FIG. 16C, a selective etch process can be performed to vertically recess the distal end portion of each dielectric core 62. For example, the dielectric cores 62 may comprise a silicon oxide material, and a wet etch process employing dilute hydrofluoric acid can be performed to vertically recess the distal end portion of each dielectric core 62. The vertically recessed horizontal surface of each dielectric core 62 can be formed between the first horizontal plane HP1 and the second horizontal plane HP2. The recess depth of each recess cavity 23 that is formed by vertically recessing the dielectric cores 62 can be greater than the first vertical extent VE1. A cylindrical distal portion of an inner sidewall of each vertical semiconductor channel 60 can be physically exposed to a respective recess cavity 23.

Referring to FIGS. 17A and 17B, a source-control-gate dielectric layer 25L, a source-control electrode layer 28L, and a cover dielectric layer 16L can be sequentially formed directly on physically exposed surfaces of each dielectric core 62, each vertical semiconductor channel 60, each tubular source strap 22, and the source layer 10. The source-control-gate dielectric layer 25L can be formed directly on a recessed surface of each dielectric core 62 that is formed by vertically recessing the end portion of each dielectric core 62.

The source-control-gate dielectric layer 25L is a gate dielectric layer for source control gates to be subsequently formed by patterning the source-control electrode layer 28L. The source-control-gate dielectric layer 25L comprises a gate dielectric material such as silicon oxide and/or a dielectric metal oxide material. The source-control-gate dielectric layer 25L can be formed employing at least one conformal deposition process. The thickness of the source-control-gate dielectric layer 25L may be in a range from 10 nm to 50 nm, such as from 10 nm to 20 nm, although lesser and greater thicknesses may also be employed.

The source-control-gate dielectric layer 25L comprises at least one metallic material, such as a combination of a metallic barrier material (such as TiN, TaN, WN, MoN, TiC, TaC, WC, etc.) and a high-conductivity metal (such as W, Ti, Ta, Mo, Ru, Co, Cu, etc.). The source-control-gate dielectric layer 25L may be deposited employing at least one chemical vapor deposition process and/or at least one physical vapor deposition process. The thickness of the source-control-gate dielectric layer 25L above the distal horizontal surface of the source layer 10 may be in a range from 50 nm to 500 nm, although lesser and greater thicknesses may also be employed.

The cover dielectric layer 16L comprises at least one dielectric material, such as silicon oxide, silicon carbonitride, and/or silicon nitride. In one embodiment, the cover dielectric layer 16L may comprise a passivation dielectric material, such as silicon nitride. The cover dielectric layer 16L may have a thickness in a range from 200 nm to 2,000 nm, although lesser and greater thicknesses may also be employed.

Referring to FIG. 18, a photoresist layer (not shown) can be applied over the distal surface of the cover dielectric layer 16L, and can be lithographically patterned to form various contact via cavities (13, 15) through the cover dielectric layer 16L, the source-control electrode layer 28L and the source-control-gate dielectric layer 25L. The photoresist layer can be subsequently removed, for example, by ashing. The various contact via cavities (13, 15) may comprise source-layer-contact via cavities 13 and backside connection via cavities 15.

A cover dielectric 16 a patterned portion of the cover dielectric layer 16L. A source-control-gate dielectric 25 is a patterned portion of the source-control-gate dielectric layer 25L. The source-control-gate dielectric 25 can be formed on distal portions of the inner sidewalls of a respective subset of the vertical semiconductor channels 60 and on the distal horizontal surface of a respective source layer 10. The source-control-gate dielectric 25 comprises vertically-extending dielectric portions overlying an inner sidewall of distal end portions of the vertical semiconductor channel 60 and a horizontally-extending dielectric portion located on and over a distal horizontal surface of the source layer 10.

A source-control electrode 28 is a patterned portion of the source-control electrode layer 28L. A surface of the source-control electrode 28 that is most proximal to the first horizontal plane HP1 is located entirely between the first horizontal plane HP1 and the second horizontal plane HP2, which includes an interface between the source layer 10 and the source-control-gate dielectric 25. The source-control electrode 28 comprises a vertically-extending electrode portion that is laterally surrounded by the vertically-extending dielectric portion of the source-control-gate dielectric 25 and a horizontally-extending electrode portion located on the horizontally-extending dielectric portion of the source-control-gate dielectric 25.

In one embodiment, each tubular source strap 22 has a first vertical extent VE1 that is less than a thickness of the source layer 10. In one embodiment, the vertically-extending electrode portion of the source-control-gate dielectric 25 has a second vertical extent VE2 that is greater than the first vertical extent VE1. The second vertical extent VE2 can be less than the thickness of the source layer 10.

In one embodiment, memory opening fill structure 58 comprises a dielectric core 62 that is laterally surrounded by the vertical semiconductor channel 60 and has a first (i.e., distal) end surface that contacts the source-control-gate dielectric 25. In one embodiment, the memory opening fill structure 58 also comprises a drain region 63 contacting a second (i.e., proximal to bonding interface 800) end surface of the dielectric core 62. In one embodiment, the vertically-extending electrode portion of the source-control electrode 28 is more proximal to the first horizontal plane HP1 than the tubular source strap 22 is to the first horizontal plane HP1.

Referring to FIG. 19, the backside connection via cavities 15 may be vertically extended through a respective source layer 10 to a respective one of the through-memory-level-via structures 82 without vertically extending the source-layer-contact via cavities 13. For example, a photoresist layer (not shown) can be applied over the cover dielectric 16, and can be lithographically patterned to form openings over the areas of the backside connection via cavities 15 while covering the areas of the source-layer-contact via cavities 13. An anisotropic etch process can be performed to increase the depth of the backside connection via cavities 15 until surfaces of the through-memory-level-via structures 82 are physically exposed. The photoresist layer can be subsequently removed, for example, by ashing.

Referring to FIG. 20, a backside dielectric spacer material layer 14L can be conformally deposited over the cover dielectric 16 and in peripheral portions of the various contact via cavities (13, 15).

Referring to FIG. 21, a photoresist layer (not shown) can be applied over the backside dielectric spacer material layer 14L, and can be lithographically patterned to form openings through the backside dielectric spacer material layer 14L in center portions of the various contact via cavities (13, 15) and in at least one area that overlies the source-control electrode 28 to form insulating spacers 14 in the contact via cavities (13, 15). An anisotropic etch process can be performed to physically expose the source layer 10 and the through-memory-level-via structure 82, and to form a cavity (i.e., opening) 17 through the backside dielectric spacer material layer 14 and the cover dielectric 16 exposing the source-control electrode 28. The photoresist layer can be subsequently removed, for example, by ashing.

Referring to FIG. 22, at least one electrically conductive layer may be deposited on the physically exposed surfaces of the source-control electrode 28, the source layer 10, and the through-memory-level-via structure 82 in the respective cavities (17, 13, 15) and over the backside dielectric spacer material layer 14L. The electrically conductive layer can be patterned to form various electrodes and/or bonding pads, which are herein referred to as backside bonding pads (18S, 18G, 18C). The backside bonding pads (18S, 18G, 18C) may comprise a source-side bonding pad 18S contacting the source layer 10, a source-control bonding pad 18G contacting the source-control electrode 28, and a memory-side connection bonding pad 18C contacting the through-memory-level-via structure 82. The memory-side connection bonding pad 18C provides electrical contact through the through-memory-level-via structure 82 to the peripheral circuit 720 in the logic die 700.

FIGS. 23A-23C are sequential vertical cross-sectional views of a region of an alternative exemplary structure according to an alternative embodiment of the present disclosure.

FIG. 23A illustrates the exemplary structure of FIG. 16B in which an air gap 62A is formed near the distal end of the dielectric core 62. The air gap 62A may be formed by incomplete filling of the bottom part of the memory opening 49 with the material of the dielectric core layer 62L at the step shown in FIG. 4B.

FIG. 23B illustrates the exemplary structure of FIG. 16C in which the dielectric core 62 is recessed such that the air gap 62A is converted to a seam or groove 62S in the distal portion of the recessed dielectric core. The distal part of the seam or groove 62S is exposed in the recess cavity 23.

FIG. 23C illustrates the exemplary structure of FIGS. 17B and 22, in which the seam or groove 62S is filled with a portion of the source-control-gate dielectric 25. The portion of the source-control-gate dielectric 25 located in the seam or groove 62S comprises a dielectric protrusion 25P. The dielectric protrusion 25P enhances the strength of attachment of the source-control-gate dielectric 25 to the dielectric core 62.

The source-control electrode 28 may be used to apply a GIDL erase voltage to the source layer 10 during an erase operation of the memory device. Specifically, during the erase operation, a signal may be provided to the source-control bonding pad 18G to generate a GIDL erase voltage in the source-control electrode 28. The GIDL erase voltage results in holes being generated in an n-type semiconductor source layer 10. The holes flow as a hole current from the source layer to the semiconductor channel 60 via the tubular source strap 22. The holes from the semiconductor channel recombine with electrons (i.e., data) stored in the charge storage layer 54 to erase the memory device (e.g., to erase a vertical NAND string). Thus, dedicated source-side erase gate electrodes located in the alternating stack (32, 46) of prior art NAND memory devices which are used to generate the GIDL voltage may be omitted in the embodiment memory device. This reduces the number of layers in the alternating stack (32, 46) and simplifies the manufacturing process of the memory device.

Referring to all drawings and according to various embodiments of the present disclosure, a memory device includes a source layer 10; an alternating stack (32, 46) of insulating layers 32 and electrically conductive layers 46 located over a proximal horizontal surface of the source layer 10; a memory opening 49 vertically extending through the alternating stack (32, 46); a memory opening fill structure 58 located in the memory opening 49 and comprising a memory film 50 and a vertical semiconductor channel 60; a source-control-gate dielectric 25 located over a distal horizontal surface of the source layer 10 which is opposite to the proximal surface of the source layer 10, and a source-control electrode 28 located over the source-control-gate dielectric 25.

In one embodiment, the vertical semiconductor channel 60 comprises a p-type semiconductor material (e.g., p-type polysilicon), the source layer 10 comprises an n-type semiconductor material (e.g., n-type polysilicon) and the memory film 50 comprises a blocking dielectric layer 52, a charge storage layer 54, and a tunneling dielectric layer 56. During an erase operation, the source-control electrode 28 is configured to apply a voltage to the source layer 10 which generates a current of holes flowing from the source layer 10 into the vertical semiconductor channel 60. The holes recombine with electrons stored in the charge storage layer 54 to erase the memory device.

In one embodiment, the memory device also includes a tubular source strap 22 *c* located on a first end portion of the memory film 50 and laterally surrounding and contacting a first end portion of the vertical semiconductor channel 60. In one embodiment, the source-control-gate dielectric 25 comprises a vertically-extending dielectric portion overlying an inner sidewall of the first end portion of the vertical semiconductor channel 60 and a horizontally-extending dielectric portion located on a distal horizontal surface of the source layer 10. The source-control electrode 28 comprises a vertically-extending electrode portion that is laterally surrounded by the vertically-extending dielectric portion and a horizontally-extending electrode portion located on the horizontally-extending dielectric portion.

In one embodiment, the memory opening fill structure 58 further comprises a dielectric core 62 that is laterally surrounded by the vertical semiconductor channel 60 and has a first end surface that contacts the source-control-gate dielectric 25, and a drain region 63 contacting a second end surface of the dielectric core 62.

In one embodiment, the vertically-extending dielectric portion includes a protrusion 25P which is embedded in a seam or groove 62S in the dielectric core 62. In one embodiment, the tubular source strap 22 has a first vertical extent that is less than a thickness of the source layer 10, and the vertically-extending electrode portion has a second vertical extent that is greater than the first vertical extent.

In one embodiment, the vertically-extending electrode portion of the source-control electrode 28 is more proximal to a first horizontal plane HP1 including an interface between the alternating stack (32, 46) and the source layer 10 than the tubular source strap 22 is to the first horizontal plane HP1.

In one embodiment, an interface between the memory film 50 and the tubular source strap 22 is located entirely between a first horizontal plane HP1 including an interface between the alternating stack (32, 46) sand the source layer 10 and a second horizontal plane HP2 including an interface between the source layer 10 and the horizontally-extending dielectric portion of the source-control-gate dielectric 25. In one embodiment, an annular end surface of the tubular source strap 22 is located within the second horizontal plane HP2.

In one embodiment, the source layer 10 comprises a higher atomic concentration of dopants than the vertical semiconductor channel 60 and than the tubular source strap 22.

In one embodiment, the tubular source strap 22 has a same lateral thickness as the memory film 50. In one embodiment, a logic die 700 is bonded to the memory device located in a memory die 900.

According to an aspect of the present disclosure, a source-control electrode 28 can be formed over a source layer 10 and includes a vertically protruding portion that is proximal to a tubular source strap 22. As such, the gate-induced leakage hole current to the vertical semiconductor channel 60 can be controlled by the source-control electrode 28 without using dedicated erase electrodes within an alternating stack of insulating layers 32 and electrically conductive layers 46. In other words, dedicated electrically conductive layers 46 within the alternating stack (32, 46) are not required for the generation of gate-induced leakage hole current, which is employed during an erase operation. The structures and methods of the embodiments of the present disclosure thus decrease the processing cost and reduce process variations by reducing and simplifying processing steps for generating the gate-induced leakage hole current during the erase operation.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   a source layer;
   an alternating stack of insulating layers and electrically conductive layers located over a proximal horizontal surface of the source layer;

a memory opening vertically extending through the alternating stack;

a memory opening fill structure located in the memory opening and comprising a memory film and a vertical semiconductor channel;

a source-control-gate dielectric located over a distal horizontal surface of the source layer which is opposite to the proximal surface of the source layer; and a source-control electrode located over the source-control-gate dielectric.

2. The memory device of claim 1, wherein:

the vertical semiconductor channel comprises a p-type semiconductor material; and the source layer comprises an n-type semiconductor material.

3. The memory device of claim 2, wherein:

the memory film comprises a blocking dielectric layer, a charge storage layer, and a tunneling dielectric layer; and during an erase operation, the source-control electrode is configured to apply a voltage to the source layer which generates a current of holes flowing from the source layer into the vertical semiconductor channel; and the holes recombine with electrons stored in the charge storage layer to erase the memory device.

4. The memory device of claim 1, further comprising a semiconductor tubular source strap located on a first end portion of the memory film and laterally surrounding and contacting a first end portion of the vertical semiconductor channel.

5. The memory device of claim 4, wherein:

the source-control-gate dielectric comprises a vertically-extending dielectric portion overlying an inner sidewall of the first end portion of the vertical semiconductor channel and a horizontally-extending dielectric portion located on the distal horizontal surface of the source layer; and the source-control electrode comprises a vertically-extending electrode portion that is laterally surrounded by the vertically-extending dielectric portion and a horizontally-extending electrode portion located on the horizontally-extending dielectric portion.

6. The memory device of claim 5, wherein the memory opening fill structure further comprises:

a dielectric core that is laterally surrounded by the vertical semiconductor channel and that has a first end surface that contacts the source-control-gate dielectric; and drain region contacting a second end surface of the dielectric core.

7. The memory device of claim 6, wherein:

the vertically-extending dielectric portion comprises a protrusion which is embedded in a seam or groove in the dielectric core;

the tubular source strap has a first vertical extent that is less than a thickness of the source layer; and the vertically-extending electrode portion has a second vertical extent that is greater than the first vertical extent.

8. The memory device of claim 5, wherein the vertically-extending electrode portion of the source-control electrode is more proximal to a first horizontal plane including an interface between the alternating stack and the source layer than the tubular source strap is to the first horizontal plane.

9. The memory device of claim 5, wherein an interface between the memory film and the tubular source strap is located entirely between a first horizontal plane including an interface between the alternating stack sand the source layer and a second horizontal plane including an interface between the source layer and the horizontally-extending dielectric portion of the source-control-gate dielectric.

10. The memory device of claim 9, wherein an annular end surface of the tubular source strap is located within the second horizontal plane.

11. The memory device of claim 4, wherein the source layer comprises a higher atomic concentration of dopants than the vertical semiconductor channel and than the tubular source strap.

12. The memory device of claim 4, wherein the tubular source strap has a same lateral thickness as the memory film.

13. The memory device of claim 1, further comprising a logic die bonded the memory device.

14. A method of forming a memory device, comprising:

forming an alternating stack of insulating layers and spacer material layers over a proximal horizontal surface of a source layer, wherein the spacer material layers are formed as or are subsequently replaced with electrically conductive layers;

forming a memory opening through the alternating stack;

forming a memory opening fill structure in the memory opening, wherein the memory opening fill structure comprises a memory film and a vertical semiconductor channel;

forming a tubular cavity by removing a portion of the memory film that is proximal to a distal horizontal surface of the source layer that is opposite to the proximal horizontal surface of the source layer;

forming a tubular source strap in the tubular cavity;

exposing a distal portion of an inner sidewall of the vertical semiconductor channel;

forming a source-control-gate dielectric on the distal portion of the inner sidewall of the vertical semiconductor channel and on the distal horizontal surface of the source layer; and forming a source-control electrode over the source-control-gate dielectric.

15. The method of claim 14, wherein:

the memory opening fill structure further comprises a dielectric core that is laterally surrounded by the vertical semiconductor channel; and the method further comprises vertically recessing an end portion of the dielectric core prior to formation of the source-control-gate dielectric layer.

16. The method of claim 15, wherein the source-control-gate dielectric layer is formed directly on a recessed surface of the dielectric core after the vertically recessing the end portion of the dielectric core.

17. The method of claim 14, wherein:

the source layer is formed over a carrier substrate; and the method further comprises removing the carrier substrate after forming the memory opening fill structure.

18. The method of claim 14, wherein the tubular cavity is formed by performing at least one etch process that etches the portion of the memory film selective to materials of the source layer and the vertical semiconductor channel.

19. The method of claim 18, further comprising:

depositing a semiconductor fill material layer in the tubular cavity and over the distal horizontal surface of the source layer; and removing a horizontally-extending portion of the semiconductor fill material layer, a distal portion of the source layer, and an end portion of the vertical semiconductor channel, wherein a remaining portion of the semiconductor fill material layer that fills the tubular cavity comprises the tubular source strap.

20. The method of claim 14, wherein:

an interface between the memory film and the tubular source strap is formed entirely between a first horizontal plane including an interface between the source layer and the alternating stack; and a surface of the source-control electrode that is most proximal to the first horizontal plane is located entirely between the first horizontal plane and a second horizontal plane including an interface between the source layer and the source-control-gate dielectric layer.

\* \* \* \* \*